US011356055B2

(12) United States Patent
Pozsgay et al.

(10) Patent No.: US 11,356,055 B2
(45) Date of Patent: Jun. 7, 2022

(54) PHOTOVOLTAIC MODULE LEVEL MONITORING SYSTEM

(71) Applicant: Fronius International GmbH, Pettenbach (AT)

(72) Inventors: Andras Pozsgay, Pettenbach (AT); Yohan Chavanel, Pettenbach (AT)

(73) Assignee: Fronius International GmbH, Pettenbach (AT)

( * ) Notice: Subject to any disclaimer, the term of this patent is extended or adjusted under 35 U.S.C. 154(b) by 0 days.

(21) Appl. No.: 15/734,886

(22) PCT Filed: Jun. 17, 2019

(86) PCT No.: PCT/EP2019/065906
§ 371 (c)(1),
(2) Date: Dec. 3, 2020

(87) PCT Pub. No.: WO2019/243268
PCT Pub. Date: Dec. 26, 2019

(65) Prior Publication Data
US 2021/0234507 A1    Jul. 29, 2021

(30) Foreign Application Priority Data

Jun. 19, 2018 (EP) .................................. 18178606

(51) Int. Cl.
*H02S 50/00* (2014.01)
*H04B 3/46* (2015.01)
*H04B 3/56* (2006.01)

(52) U.S. Cl.
CPC ............... *H02S 50/00* (2013.01); *H04B 3/46* (2013.01); *H04B 3/56* (2013.01)

(58) Field of Classification Search
None
See application file for complete search history.

(56) References Cited

U.S. PATENT DOCUMENTS

| 9,130,651 B2 | 9/2015 | Tabe |
| 9,337,943 B2 | 5/2016 | Mosebrook et al. |

(Continued)

FOREIGN PATENT DOCUMENTS

| CN | 102232165 A | 11/2011 |
| CN | 103202076 A | 7/2013 |

(Continued)

OTHER PUBLICATIONS

Yukizane et al.; Power Line Communication Device, Solar Power Generation System, Power Line Communication Method, and Power Line Communication Program; EP 2725678 A1;Apr. 30, 2014;H 04 B 3/542 (Year: 2014).*

(Continued)

*Primary Examiner* — Nasima Monsur
(74) *Attorney, Agent, or Firm* — Maginot Moore Beck LLP

(57) ABSTRACT

A photovoltaic, PV, module level monitoring, MLM, system (1) comprising a base station, BS, (2) connected by means of power cables (3) to module level devices, MLD, (4) which are provided to monitor and/or to control associated photovoltaic modules, PVMs, (5), wherein the base station, BS, (2) comprises a base station transmitter (2A) adapted to transmit Rapid Shut Down, RSD, control signals, CS, in predefined time slots, $TS_{CS}$, in a downlink channel, DL-CH, through said power cables (3) to said module level devices, MLDs, (4) and a base station receiver (2B) adapted to receive monitoring signals, MS, generated by said module level devices, MLDs, (4) through said power cables (3) within time slots, $TS_{MS}$, via an uplink channel, UL-CH, assigned to the module level devices, MLDs, (4).

13 Claims, 28 Drawing Sheets

(56) References Cited

U.S. PATENT DOCUMENTS

| | | | |
|---|---|---|---|
| 2006/0162772 | A1 | 7/2006 | Presher, Jr. et al. |
| 2010/0082171 | A1 | 4/2010 | Takehara et al. |
| 2010/0118985 | A1 | 5/2010 | Rozenboim |
| 2011/0287798 | A1* | 11/2011 | Ono ............ H04B 7/0413 455/509 |
| 2013/0332093 | A1 | 12/2013 | Adest et al. |
| 2015/0288330 | A1 | 10/2015 | Sella et al. |
| 2016/0036493 | A1 | 2/2016 | Pozsgay et al. |

FOREIGN PATENT DOCUMENTS

| | | |
|---|---|---|
| CN | 103703647 A | 4/2014 |
| CN | 105490388 A | 4/2016 |
| CN | 207304483 U | 5/2018 |
| EP | 2 725 678 A1 | 4/2014 |
| WO | 2017/038844 A1 | 3/2017 |

OTHER PUBLICATIONS

Sauro Macerini et al.; Communication Signal for Rapid Shutdown; SunSpec Interoperability Specification; Draft Version 25 Sep. 26, 2016; p. 1-24 (Year: 2016).*

Examination Report No. 1 for standard patent application corresponding to Australian Patent Application No. 2019289708, dated May 28, 2021 (4 pages).

Chinese Language First Office Action corresponding to Chinese Patent Application No. 201980041206, dated Apr. 26, 2021 (6 pages).

European Search Report corresponding to European application No. 18178606.2 dated Oct. 10, 2018, (11 pages).

Sunspec: "Communication Signal for Rapid Shutdown SunSpec Interoperability Specification," Sep. 26, 2016, XP055511838, Retrieved from the Internet: URL:https://sunspec.org/wp-content/uploads/2015/08/SunSpec-Specification-Communication-Signal-For-Rapid-Shutdown-Rev25.pdf [retrieved on Oct. 2, 2018] (24 pages).

* cited by examiner

Pairing Process

Pairing Process Compatible with RSD

| 0 | 1 | 2 | 3 | 4 | 5 | 6 | 7 | 8 | 9 | 10 |
|---|---|---|---|---|---|---|---|---|---|---|
| W0-W0-W0 | | | Z | W0-W0-W0 | | | Z | W0-W0-W0 | | |

| Symbol | Description |
|---|---|
| "W0" | Logical "0": interpreted as 0 by the receiver, inverse Barker-11 code |
| "W1" | Logical "1": interpreted as 1 by the receiver, Barker-11 code |
| "Z" | Zero energy: separates symbols within a frame in order to avoid sending SunSpec code sequences during address assignment |

| Name | Width (bits) | Offset (DW:bits) | Description |
|---|---|---|---|
| ID [ 31:16 ] | 16 | 0:0 | Device ID: Mmanufacturer serial number, encoded in 32 bits. |
| ID [ 15:0 ] | 16 | 1:0 | |
| TYPE | 4 | 2:0 | Equipment Type: type of Module Level Device (Smart PV module without optimizer, Optimizer, sensor ...). Values from [ 0 ...15 ] |
| SEQ | 5 | 2:4 | Code Sequence: 5-bit CRC of the 32-bit ID, this code is repeated in the address assignment response from the base station. |
| Reserved | 7 | 2:9 | Reserved field: field not used, receiver should ignore these bits |
| CRC-16 | 16 | 3:0 | CRC-16: CRC calculated from the preceding 48 bits |

Fig. 24

PHOTOVOLTAIC MODULE LEVEL MONITORING SYSTEM

This application is a 35 U.S.C. 371 National Stage application of PCT/EP2019/0659065, filed Jun. 17, 2019, and claims priority to European Application No. EP 18178606.2 filed on Jun. 19, 2018. The entire contents of the above-mentioned patent applications are incorporated herein by reference as part of the disclosure of this U.S. application.

A photovoltaic module level monitoring system

The invention relates to a photovoltaic module level monitoring system and a method for providing a bidirectional communication between a base station and module level devices, MLDS, of the module level monitoring, MLM, system used to monitor and/or to control associated photovoltaic modules, PVMS, via power cables connecting the base station of the module level monitoring system with the module level devices of the module level monitoring system.

A photovoltaic system can comprise one or more strings of photovoltaic modules, PMVS, within a photovoltaic array. The photovoltaic array can be connected via a DC line to an inverter adapted to convert the DC current received from the photovoltaic array into an AC current supplied to a distribution network. In photovoltaic systems powerline communication PLC can be used. The powerline communication PLC has been chosen recently by the SunSpec Consortium to generate a keep alive signal to control a Rapid Shutdown RSD of a photovoltaic array at photovoltaic module level as requested by NEC2017. The employed modulation scheme defined by SunSpec for the Rapid Shutdown RSD is based on an S-FSK modulation over the DC powerline connecting the photovoltaic modules of the photovoltaic system. Since module level rapid shutdown becomes mandatory for photovoltaic installations there is a need to provide communication between module level electronic devices and the inverters of the photovoltaic system which is compatible with the SunSpec RSD standard.

Accordingly, it is an object of the present invention to provide a method and a system for providing a bidirectional communication between a base station and module level devices which is efficient and compatible with the SunSpec RSD standard.

This object is achieved according to a first aspect of the present invention by a photovoltaic module level monitoring system comprising the features of claim 1.

The invention provides according to the first aspect a photovoltaic module level monitoring system comprising a base station connected by means of power cables to module level devices which are provided to monitor and/or to control associated photovoltaic modules, wherein the base station comprises:

a base station transmitter adapted to transmit Rapid Shut Down, RSD, control signals in predefined time slots in a downlink channel through said power cables to said module level devices and a base station receiver adapted to receive monitoring signals generated by said module level devices through said power cables within time slots via an uplink channel assigned to the module level devices.

The photovoltaic module level monitoring system according to the first aspect of the present invention is not only compatible with the SunSpec RSD standard but does even take advantage of the PLC signalling implemented in the RSD standard.

In a possible embodiment of the photovoltaic module level monitoring system according to the first aspect of the present invention, the downlink channel used for transmission of the Rapid Shut Down, RSD, control signals within predefined time slots and the uplink channel used for transmission of the monitoring signals within assigned time slots are synchronized to each other.

In a still further possible embodiment of the photovoltaic module level monitoring system according to the first aspect of the present invention, the Rapid Shut Down, RSD, control signal transmitted by the base station transmitter to said module level devices and the monitoring signals generated by said module level devices and transmitted to the base station receiver are modulated at different carrier frequencies.

In a still further possible embodiment of the photovoltaic module level monitoring system according to the first aspect of the present invention, the modulation bandwidth occupied by the modulated Rapid Shut Down, RSD, control signal transmitted through the power cables in the downlink channel and the modulated monitoring signal transmitted simultaneously through the power cables in the uplink channel is reduced by baseband pulse shaping.

In a still further possible embodiment of the photovoltaic module level monitoring system according to the first aspect of the present invention, the time slots of the uplink channel assigned to module level devices are inside the predefined time slots of the downlink channel.

In a further possible embodiment of the photovoltaic module level monitoring system according to the first aspect of the present invention, several module level devices and the base station are connected with each other through power cables in a DC power network.

In a still further possible embodiment of the photovoltaic module level monitoring system according to the first aspect of the present invention, the transmitter and receiver of the base station and of each module level device connected to each other through power cables in the DC power network are coupled to said DC power network by means of a duplexer circuit comprising a high current transformer adapted to isolate the transmitter from the receiver.

In a further possible embodiment of the photovoltaic module level monitoring system according to the first aspect of the present invention, each module level device comprises a module level monitoring transmitter adapted to transmit a monitoring signal generated by the module level device in a time slot of the uplink channel assigned to said module level device to the base station receiver of said base station and a Rapid Shut down receiver adapted to receive a Rapid Shut Down, RSD, control signal generated by said base station in a time slot of the downlink channel.

In a further possible embodiment of the photovoltaic module level monitoring system according to the first aspect of the present invention, each module level device comprises an assigned unique time slot address number defining a time slot of the up-link channel, where the module level monitoring transmitter of said module level device sends a monitoring signal generated by said module level device in the addressed time slot once per monitoring cycle.

In a still further possible embodiment of the photovoltaic module level monitoring system according to the first aspect of the present invention, the unique time slot address number is assigned to the respective level monitoring device after installation of the photovoltaic module level monitoring system in a pairing process and stored in a local memory of the module level device.

In a further possible embodiment of the photovoltaic module level monitoring system according to the first aspect of the present invention, the base station transmitter of the base station is connected to a Rapid Shut Down initiator and is adapted to transmit a permission to operate, PTO, signal periodically in the downlink channel when the Rapid Shut Down initiator indicates that rapid shutdown is not active and is further adapted to stop transmitting the permission to operate, PTO, signal when the initiator indicates that rapid shutdown is active.

In a further possible embodiment of the photovoltaic module level monitoring system according to the first aspect of the present invention, the base station receiver of the base station is connected to a communication gateway via a wired or wireless data network.

In a still further possible embodiment of the photovoltaic module level monitoring system according to the first aspect of the present invention, each module level device is adapted to monitor and/or to control physical parameters of at least one associated photovoltaic module including a current, a voltage, a temperature and/or an energy produced by said photovoltaic module.

In a still further possible embodiment of the photovoltaic module level monitoring system according to the first aspect of the present invention, each module level device comprises a DC switch used for switching on/off its associated photovoltaic module depending on the Rapid Shut Down, RSD, control signals received by the rapid shutdown receiver of the respective module level device via the downlink channel.

In a still further possible embodiment of the photovoltaic module level monitoring system according to the first aspect of the present invention, the base station is integrated in or connected to an inverter adapted to convert a DC power supplied by the photovoltaic modules via the power cables to said inverter into an AC current.

The invention further provides according to a second aspect a method for providing a bidirectional communication comprising the features of claim 16.

The invention provides according to the second aspect a method for providing a bidirectional communication between a base station and module level devices used to monitor and/or to control associated photovoltaic modules via power cables connecting the base station with the module level devices, wherein the method comprises the steps of:

transmitting by said base station through said power cables Rapid Shut Down, RSD, control signals to said module level devices in predefined time slots of a downlink channel and transmitting simultaneously by the module level devices through said power cables monitoring signals to said base station in time slots of an uplink channel assigned to the module level devices.

In the following, possible embodiments of the different aspects of the present invention are described in more detail with reference to the enclosed figures.

Figure 23:
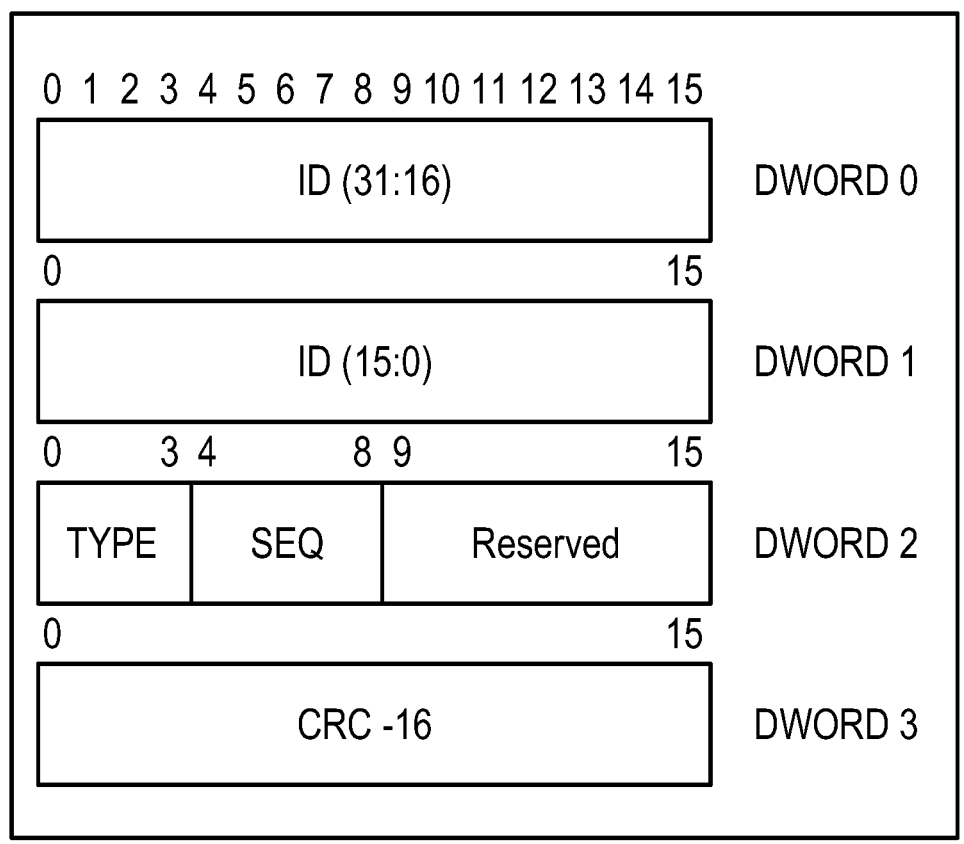
FIG. 23 illustrates a possible data structure of an address assignment request frame which can be used in a possible embodiment of the present invention.
Figure 25:
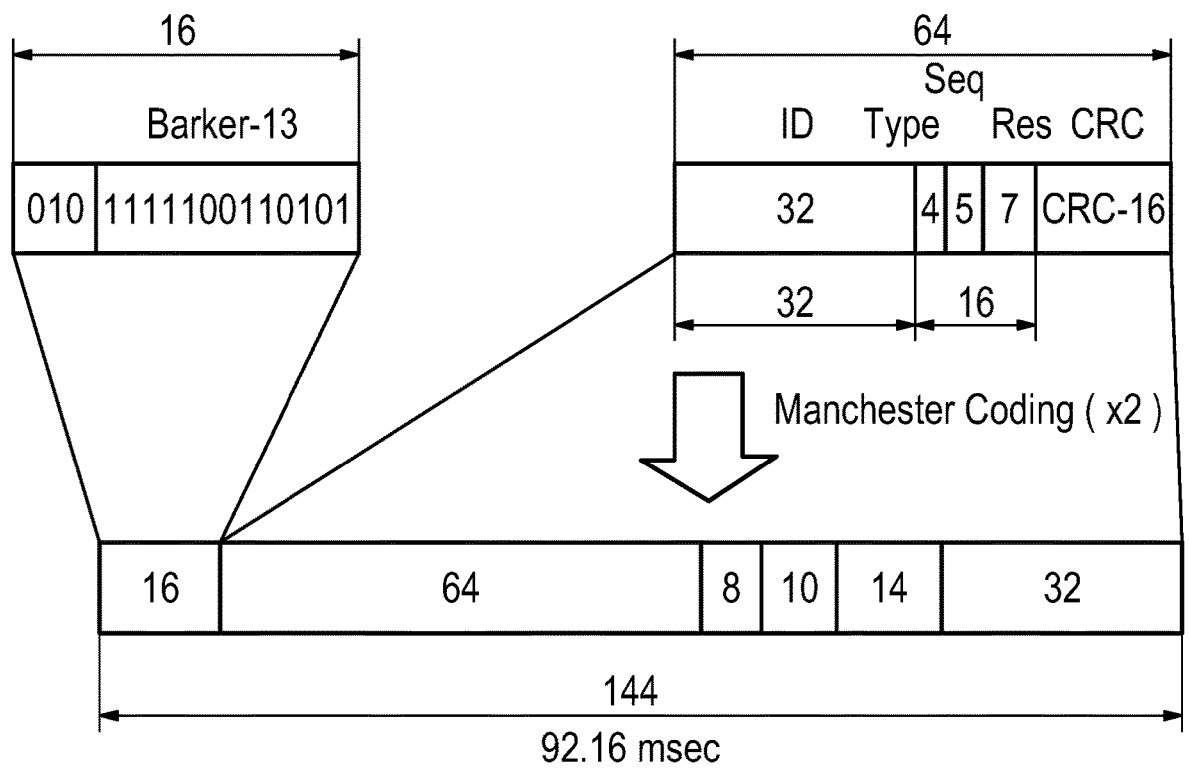
Figure 26:
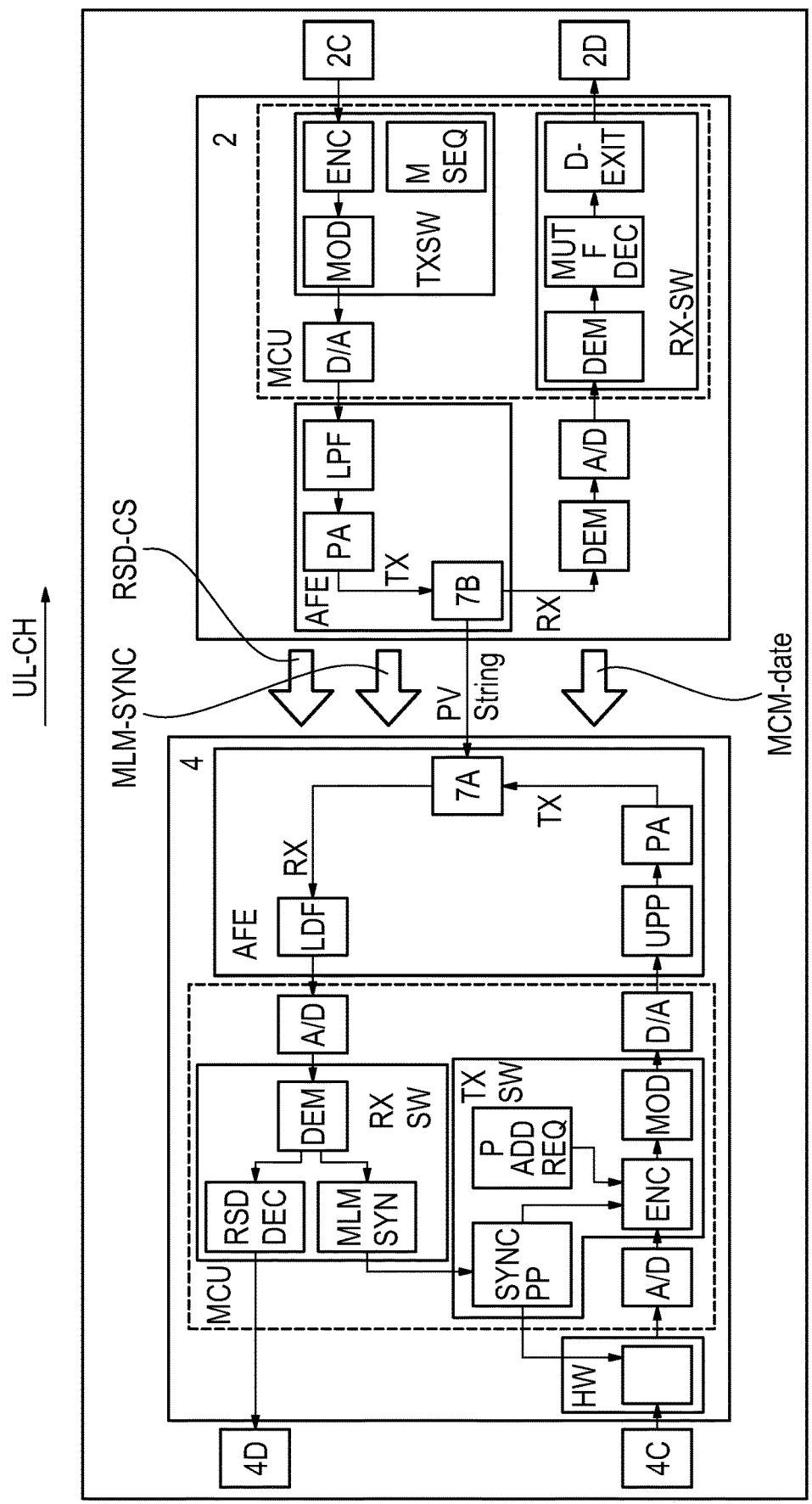
Figure 27:
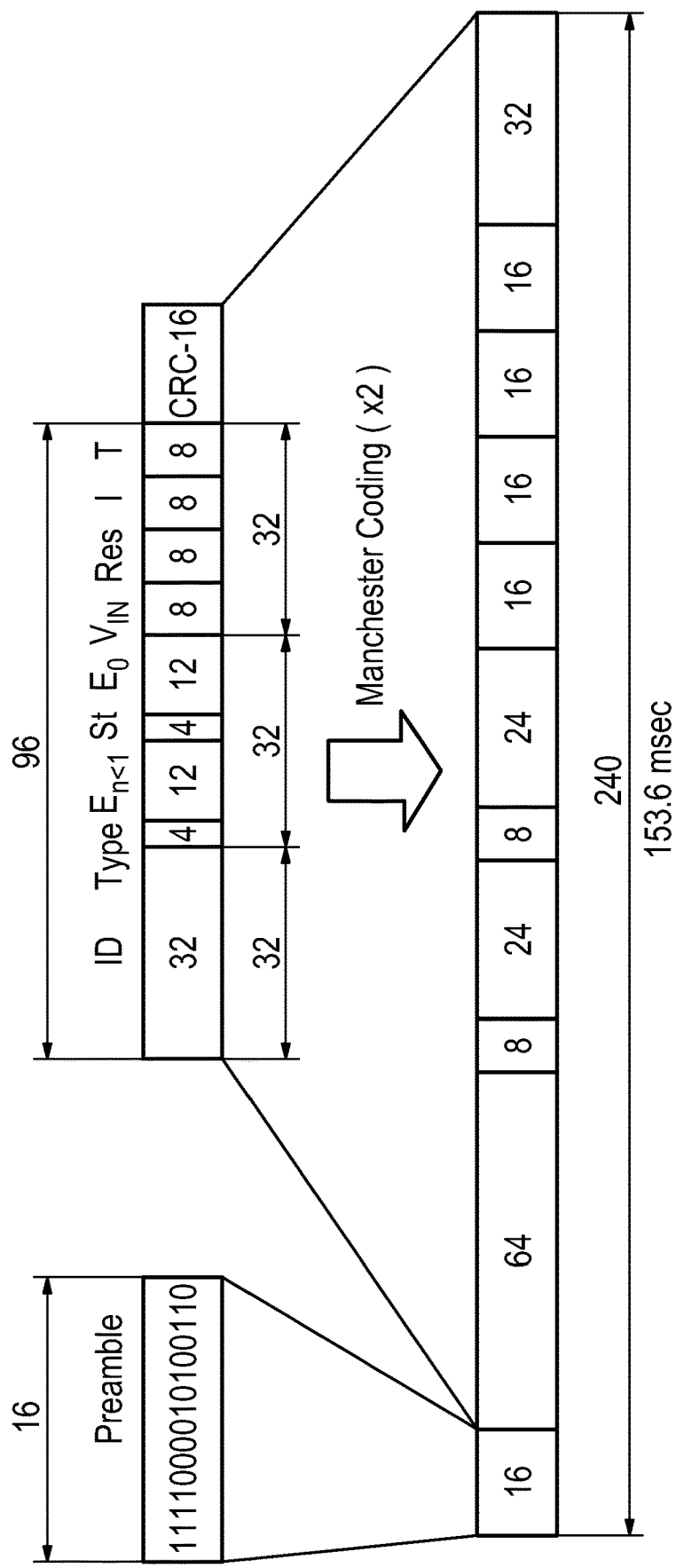
Figure 28:
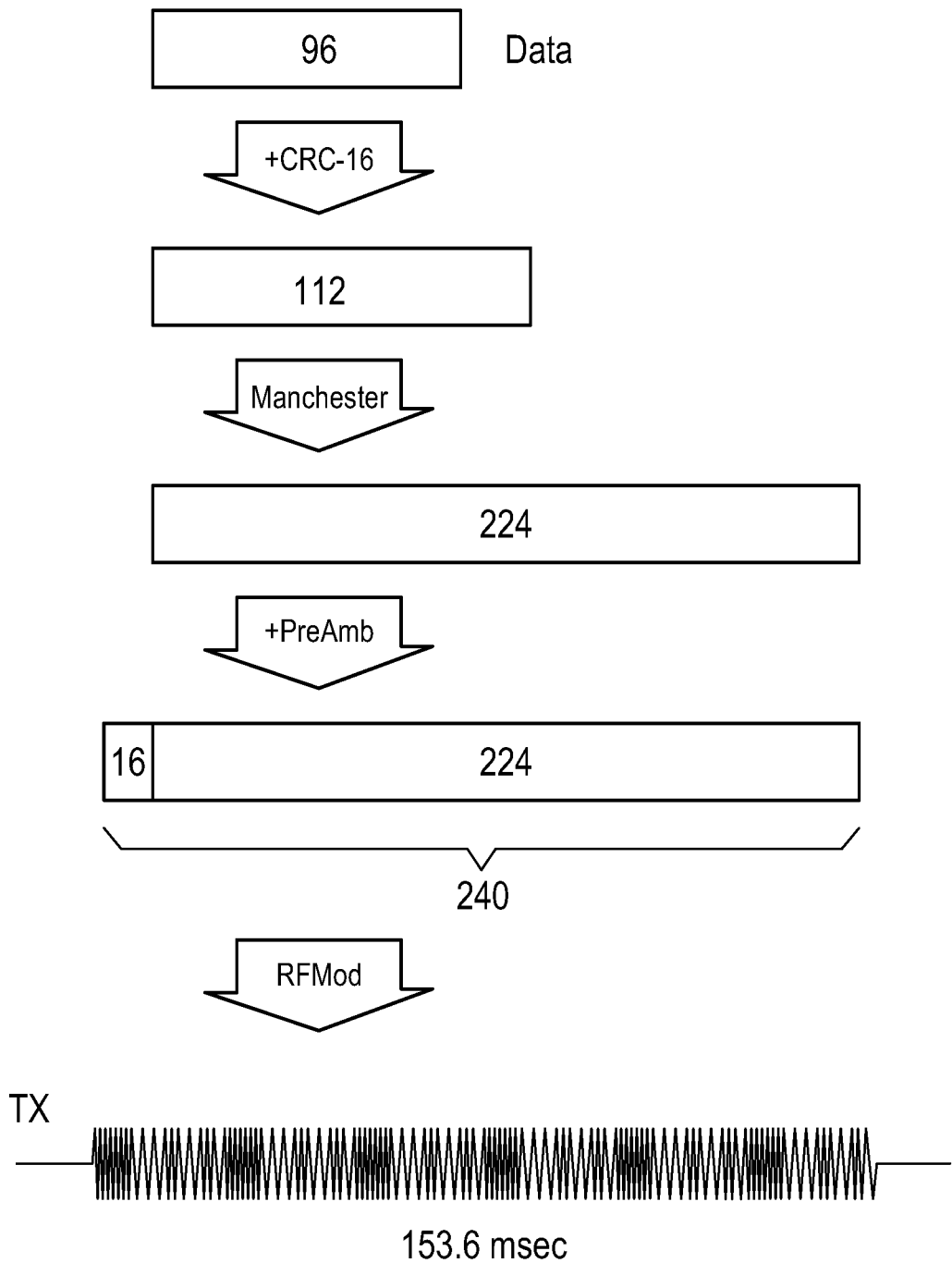
Figure 29:
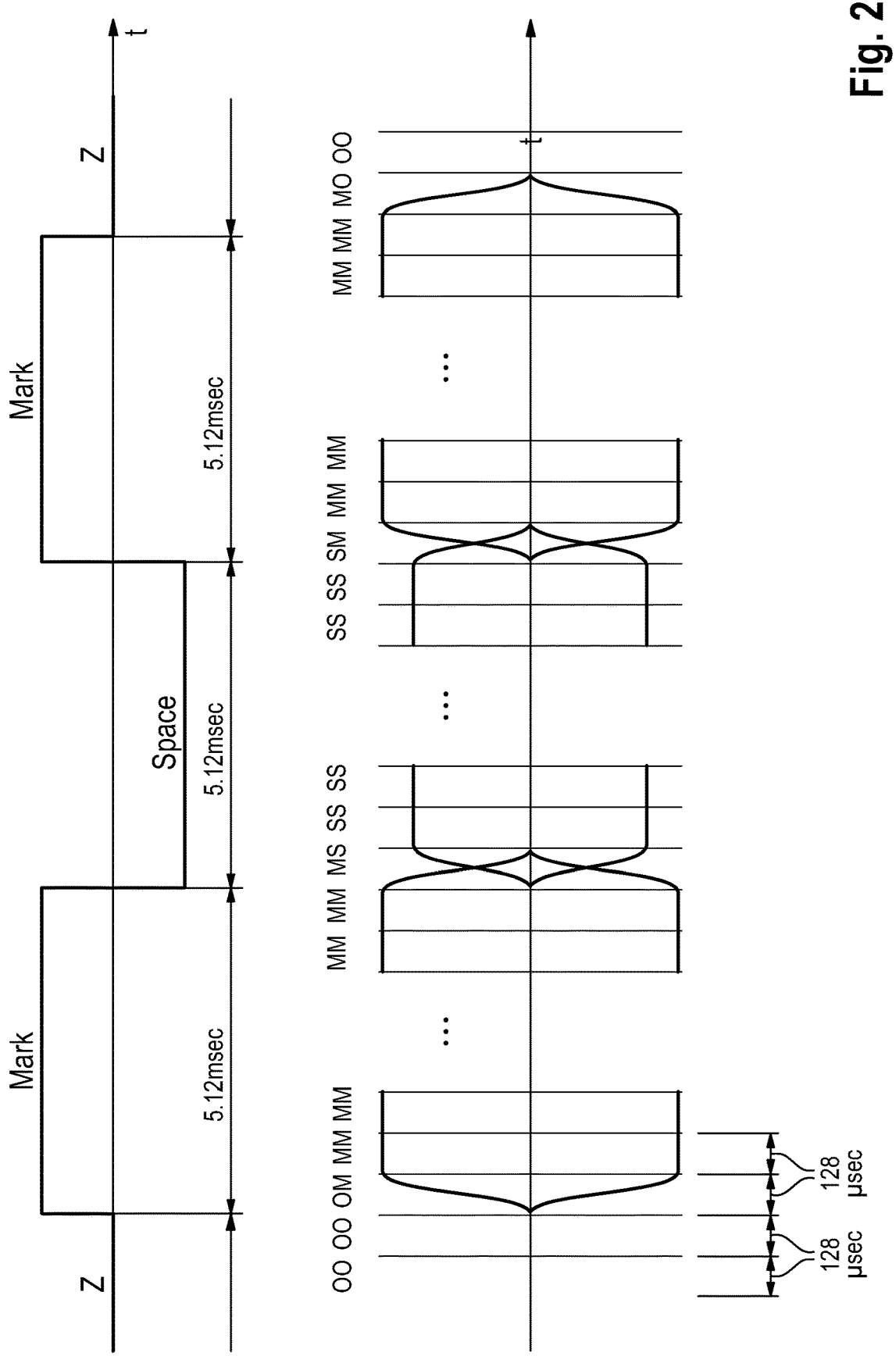
Figure 30:
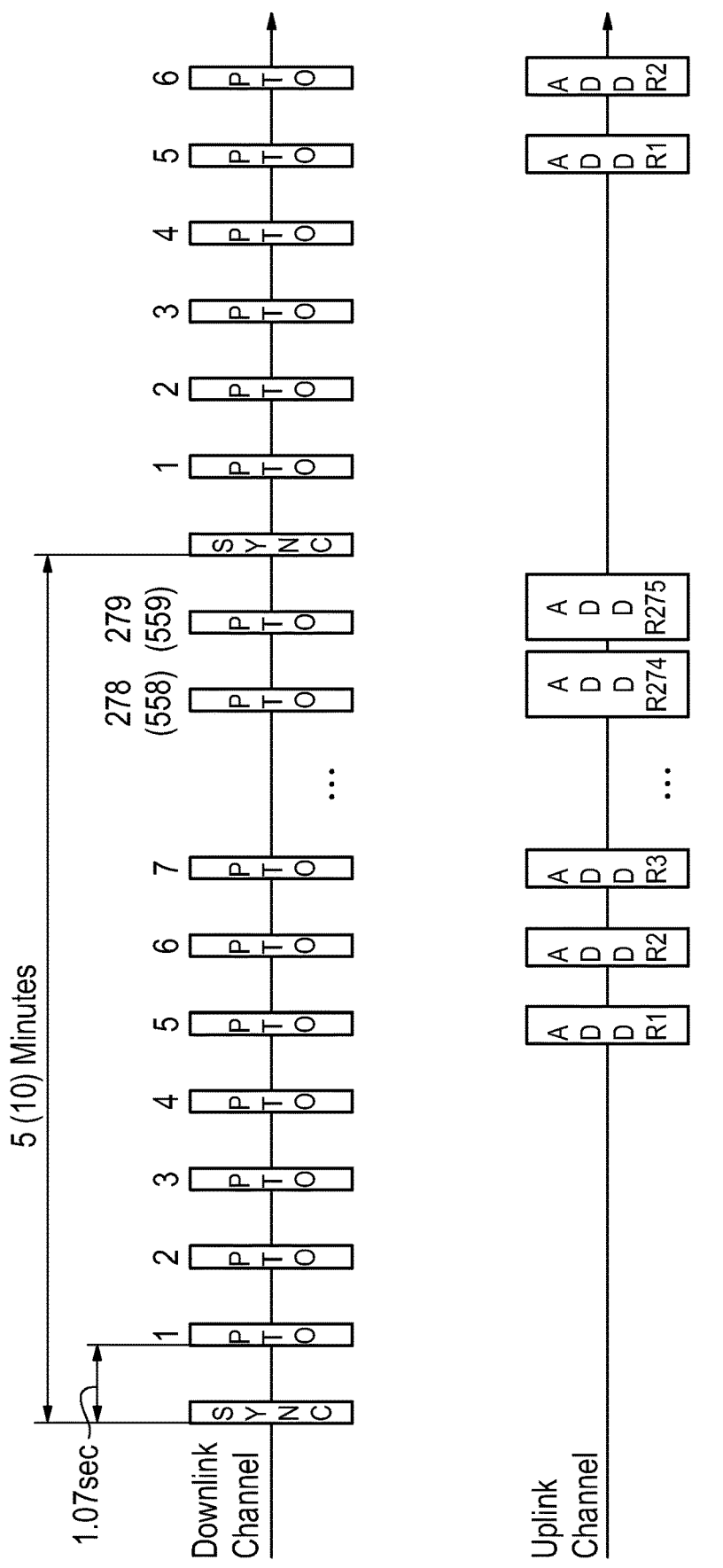
Figure 31:
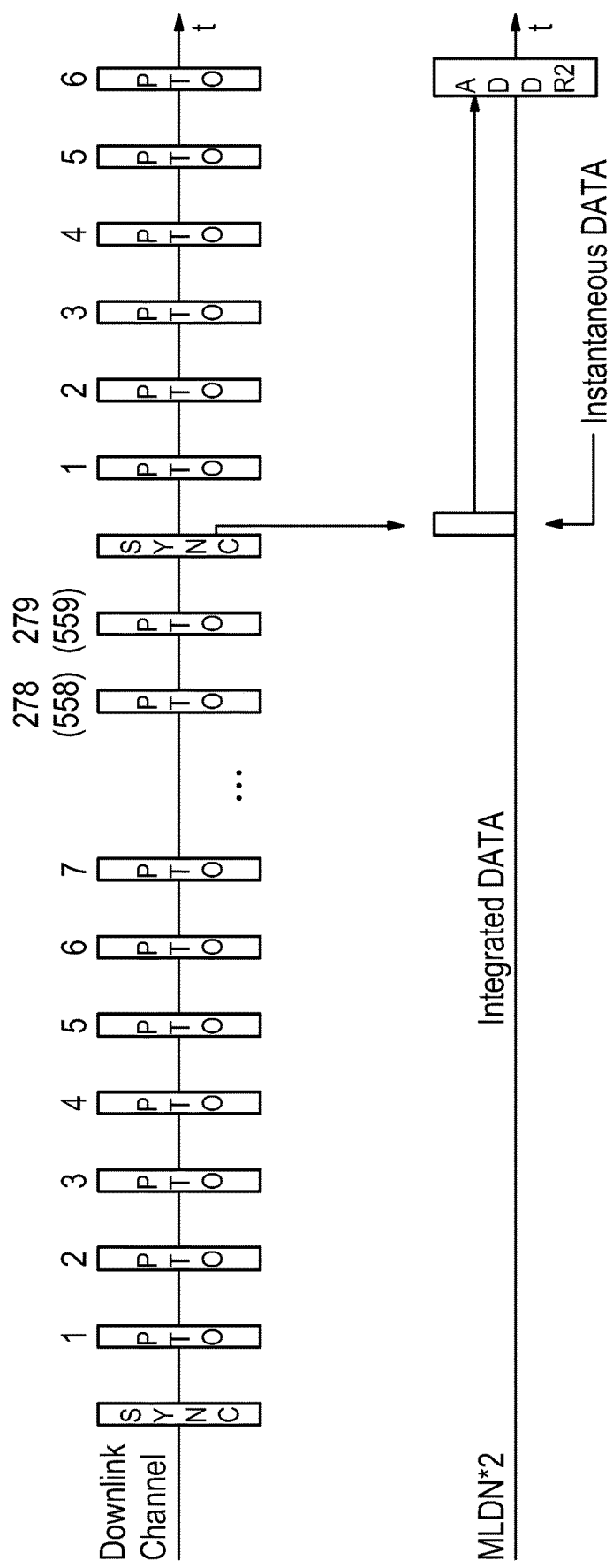
Figure 32:
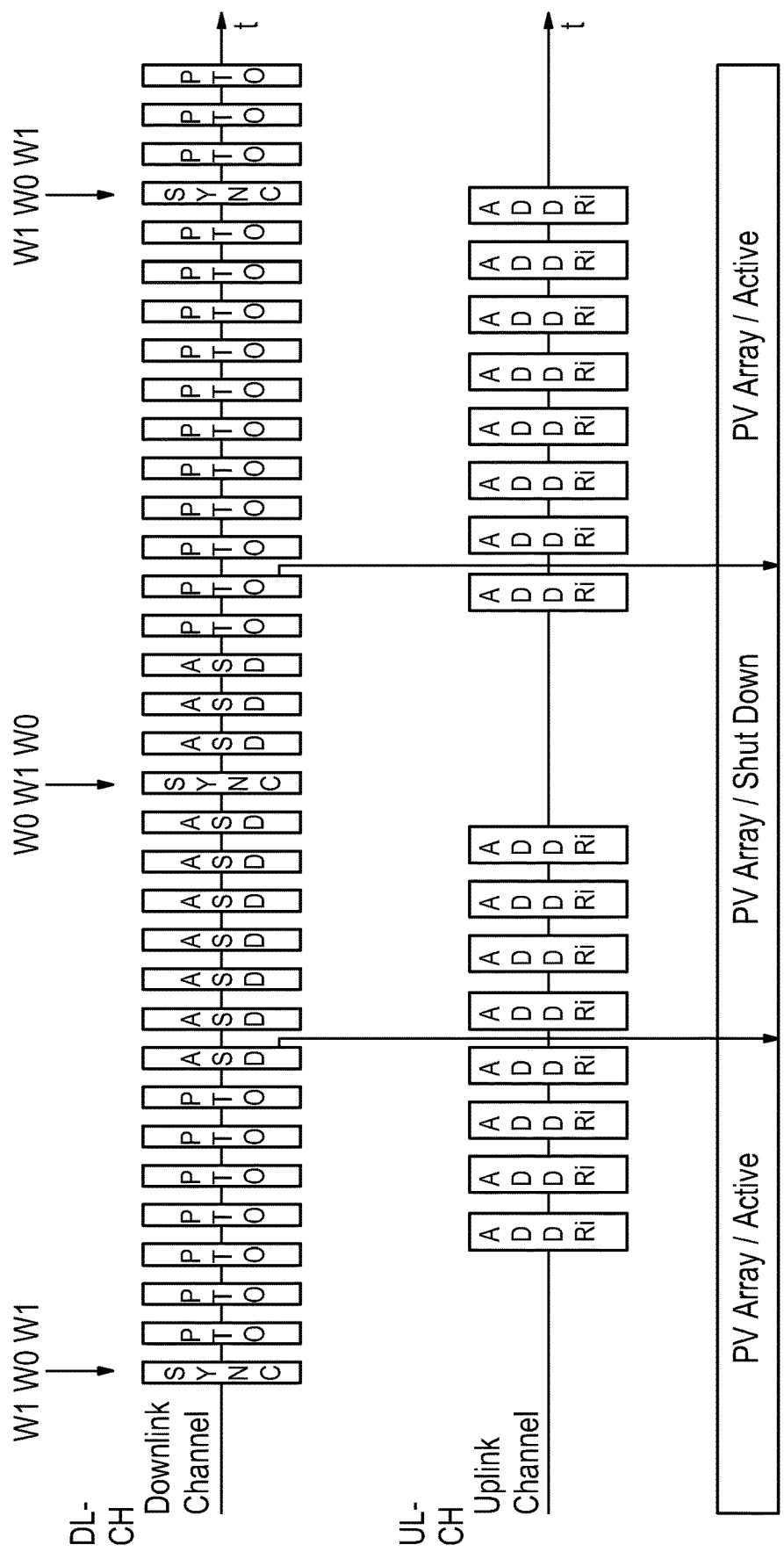

FIG. 24 specifies data fields within an address request frame as illustrated in FIG. 23;

FIG. 25 illustrates the encoding of an address request frame in a possible implementation of the system according to the present invention;

FIG. 26 shows a block diagram of a possible exemplary hardware/software architecture of a possible embodiment of the MLM system according to the present invention;

FIG. 27 shows a diagram for illustrating a transmission (TX) data frame assembly which can be performed in a possible embodiment of the system according to the present invention;

FIG. 28 illustrates a transmission (TX) burst generation performed in a possible embodiment of the system according to the present invention;

FIG. 29 shows a construction of an RSD FSK signal using look-up tables in a possible exemplary embodiment of the system according to the present invention;

FIG. 30 illustrates synchronization messages and uplink message sequencing performed in a possible exemplary embodiment of the system according to the present invention;

FIG. 31 illustrates a transmission of instantaneous and integrated data according to a possible exemplary embodiment of the system according to the present invention;

FIG. 32 illustrates downlink and uplink messages as well as photovoltaic array states and a mode of operation changes in a possible exemplary embodiment of the system according to the present invention.

Figure 1A:
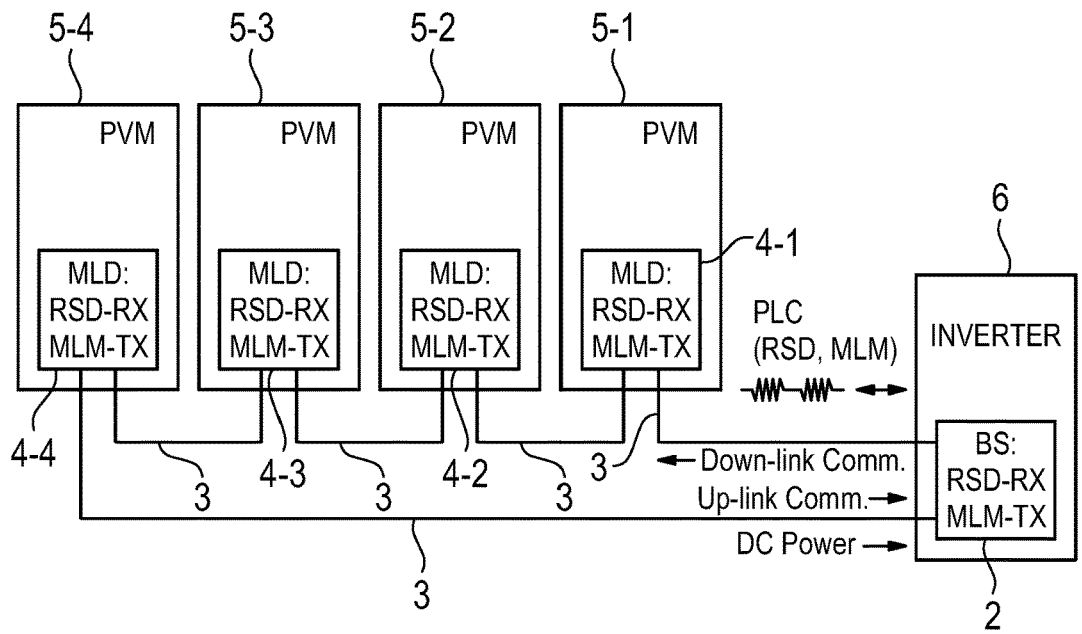
FIG. 1 shows a block diagram for illustrating a possible exemplary embodiment of a photovoltaic module level monitoring system according to the first aspect of the present invention.
Figure 1B:
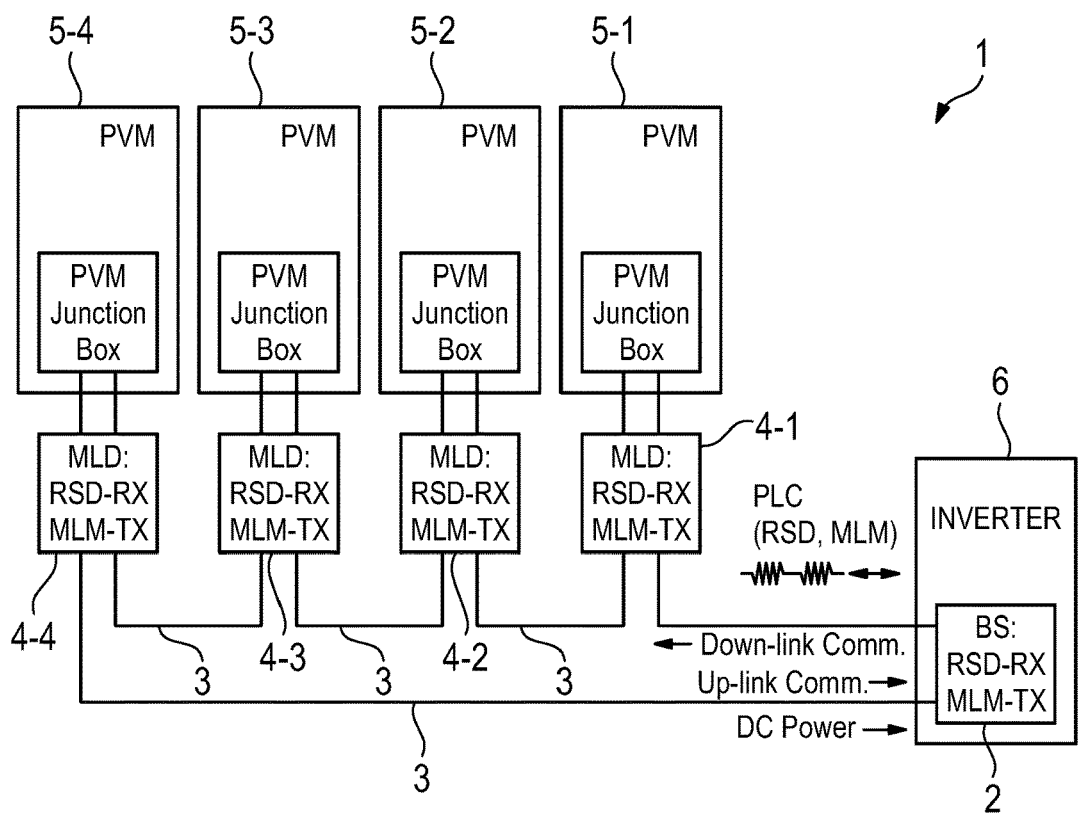
Figure 1C:
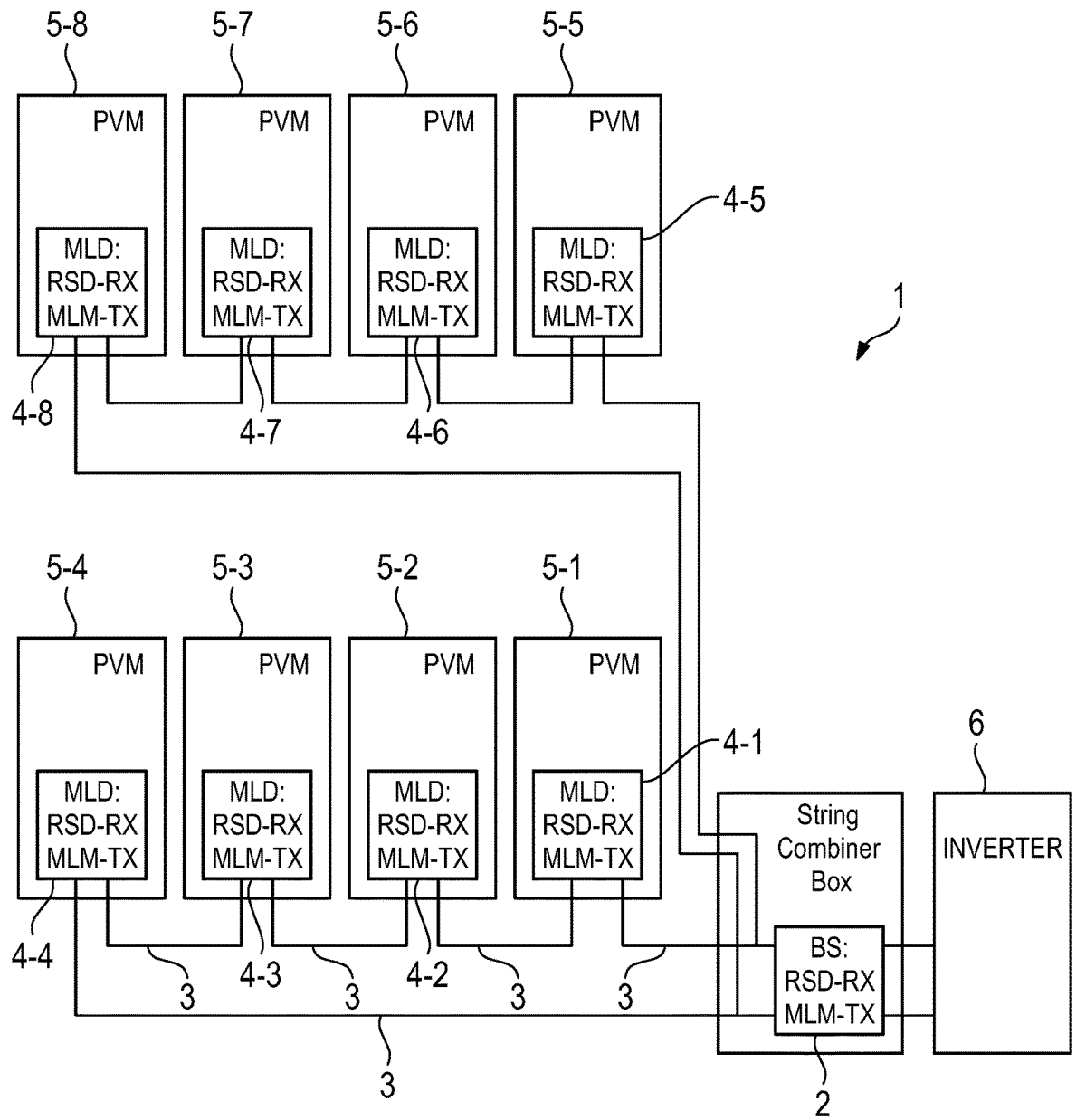
Figure 2:
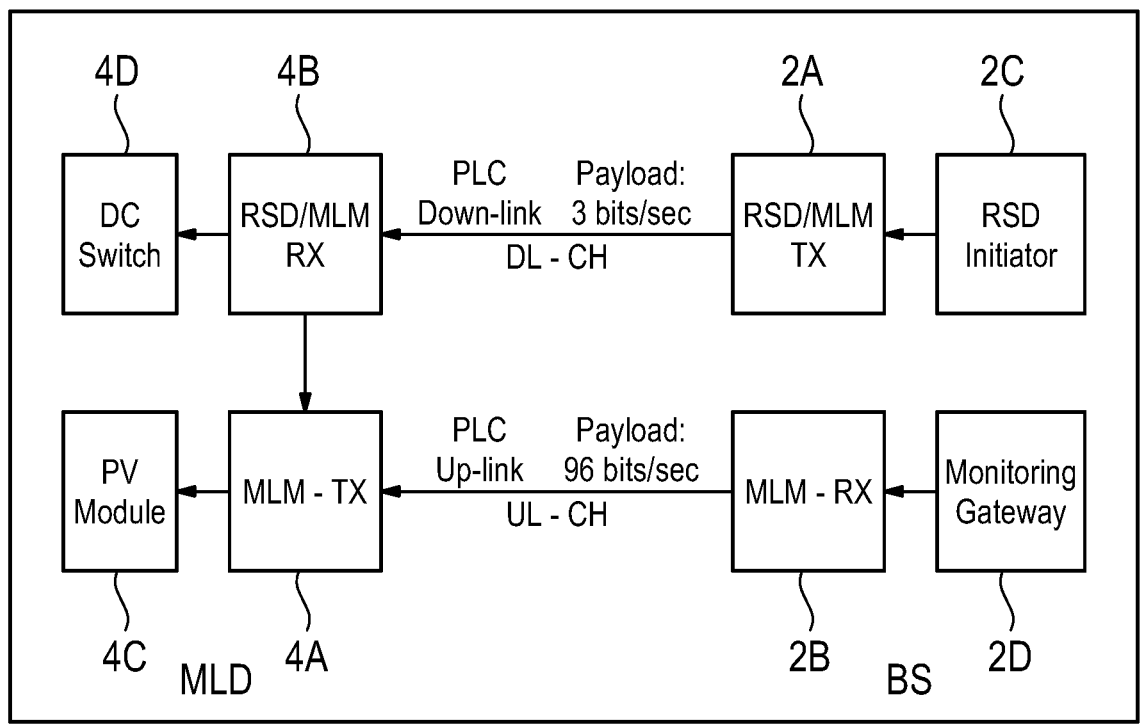
FIG. 2 illustrates a block diagram of a connection and basic structure of module level devices and a base station of a photovoltaic module level monitoring system according to the first aspect of the invention.

As can be seen in the block diagram of FIG. 1, a photovoltaic, PV, module level monitoring, MLM, system 1 can comprise a base station 2 connected by means of power cables 3 to module level devices (MLD) 4. The module level devices 4-i are provided to monitor and/or to control associated photovoltaic modules 5 as shown in FIG. 1. The module level devices 4-i are coupled to the DC power network, for instance by means of a duplexer circuit. The number of module level devices 4-i coupled to a DC power network can vary depending on the use case. In the illustrated embodiment of FIG. 1, four module level devices 4-1, 4-2, 4-3, 4-4 are coupled to the DC power network or DC power loop comprising a base station 2. In the illustrated embodiment of FIG. 1, the base station 2 is integrated in an inverter 6. The base station 2 is connected by means of the power cables 3 to the different module level devices 4-i coupled to the DC power network. The module level devices 4-i are provided to monitor and/or to control the associated photovoltaic modules 5. The base station 2 comprises a base station transmitter TX and a base station receiver RX as also illustrated in FIG. 2. The base station transmitter of the base station 2 is adapted to transmit Rapid Shutdown, RSD, control signals, CS, in predefined time slots $TS_{CS}$ in a downlink channel, DL-CH, through said power cables 3 to the model level devices MLDs, 4. Further, the base station receiver of the base station 2 is adapted to receive monitoring signals, MS, generated by the module level devices, MLDs, 4 through said power cables 3 within time slots $TS_{MS}$ via an uplink channel, UL-CH, assigned to the module level devices, MLDs, 4.

In the illustrated embodiment of FIG. 1, the base station 2 forms part of a photovoltaic inverter 6. In an alternative embodiment, the base station 2 can also form part of an add-on box of a separate device.

The photovoltaic module level monitoring, MLM, system 1 as illustrated in FIG. 1 comprises a downlink channel, DL-CH, and an uplink channel, UL-CH. The downlink channel, DL-CH, is used for transmission of Rapid Shut-down, RSD, control signals, CS, within predefined time slots $TS_{CS}$. The uplink channel, UL-CH is used for transmission of monitoring signals, MS, within assigned time slots $TS_{MS}$. The downlink channel, DL-CH, and the uplink channel, UL-CH, are synchronized to each other. Further, the Rapid Shut-down, RSD, control signals, CS, transmitted by the base station transmitter of the base station 2 to the module level devices, MLDs, 4 and the monitoring signals, MS, generated by the module level devices, MLDs, 4 transmitted to the base station receiver of the base station 2 are modulated at different carrier frequencies.

In a possible embodiment, the modulation bandwidth occupied by the modulated rapid shutdown, RSD, control signal, CS, transmitted through the power cable 3 in the downlink channel, DL-CH, and the modulated monitoring signal, MS, transmitted simultaneously through the power cables 3 and the uplink channel, UL-CH, is reduced by baseband, BB, pulse shaping.

Figure 4:
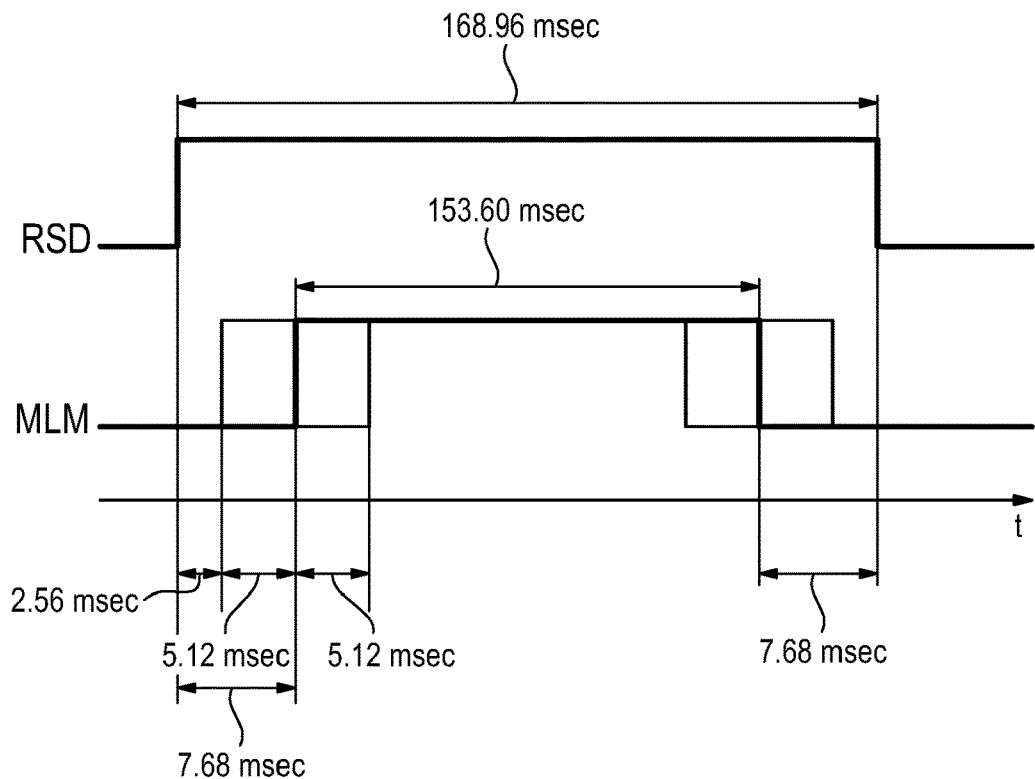
FIG. 4 shows a diagram for illustrating the synchronization of a downlink channel and an uplink channel according to a possible exemplary embodiment of the photovoltaic module level monitoring system according to the first aspect of the present invention.

In a preferred embodiment of the photovoltaic module level monitoring system, MLM, system 1, the time slots, $TS_{MS}$, of the uplink channel, UL-CH, assigned to the model level devices, MLDs, 4 are inside the predefined time slots, $TS_{CS}$, of the downlink channel, DL-CH, as also illustrated in FIG. 4. The module level devices, MLDs, 4 and the base station 2 are connected with each other via power cables 3 in a DC power network or DC power loop as shown in FIG. 1. The transmitter and receiver of the base station 2 and of each module level device, MLD, 4 connected to each through power cables 3 in the DC power network can be coupled to said DC power network by means of duplexer circuits 7 comprising a high current transformer TR adapted to isolate the transmitter from the receiver as described in context with FIGS. 13 to 16.

Each module level device, MLD, 4 comprises in a possible embodiment a module level monitoring, MLM, transmitter, MLM-TX, and a Rapid Shutdown, RSD, receiver, RSD-RX. The module level monitoring, MLM, transmitter of the module level device, MLD, 4 is adapted to transmit a monitoring signal, MS, generated by the module level device, MLD, 4 in a time slot, $TS_{MS}$, of the uplink channel, UL-CH, assigned to said module level device MLD, 4 to the base station receiver of the base station, BS, 2. Further, the Rapid Shutdown, RSD, receiver, RSD-RX, of each module level device, MLD, 4 is adapted to receive a Rapid Shutdown, RSD, control signal, CS, generated by the base station, BS, 2 in a time slot, $TS_{CS}$, of the downlink channel, DL-CH.

Figure 17:
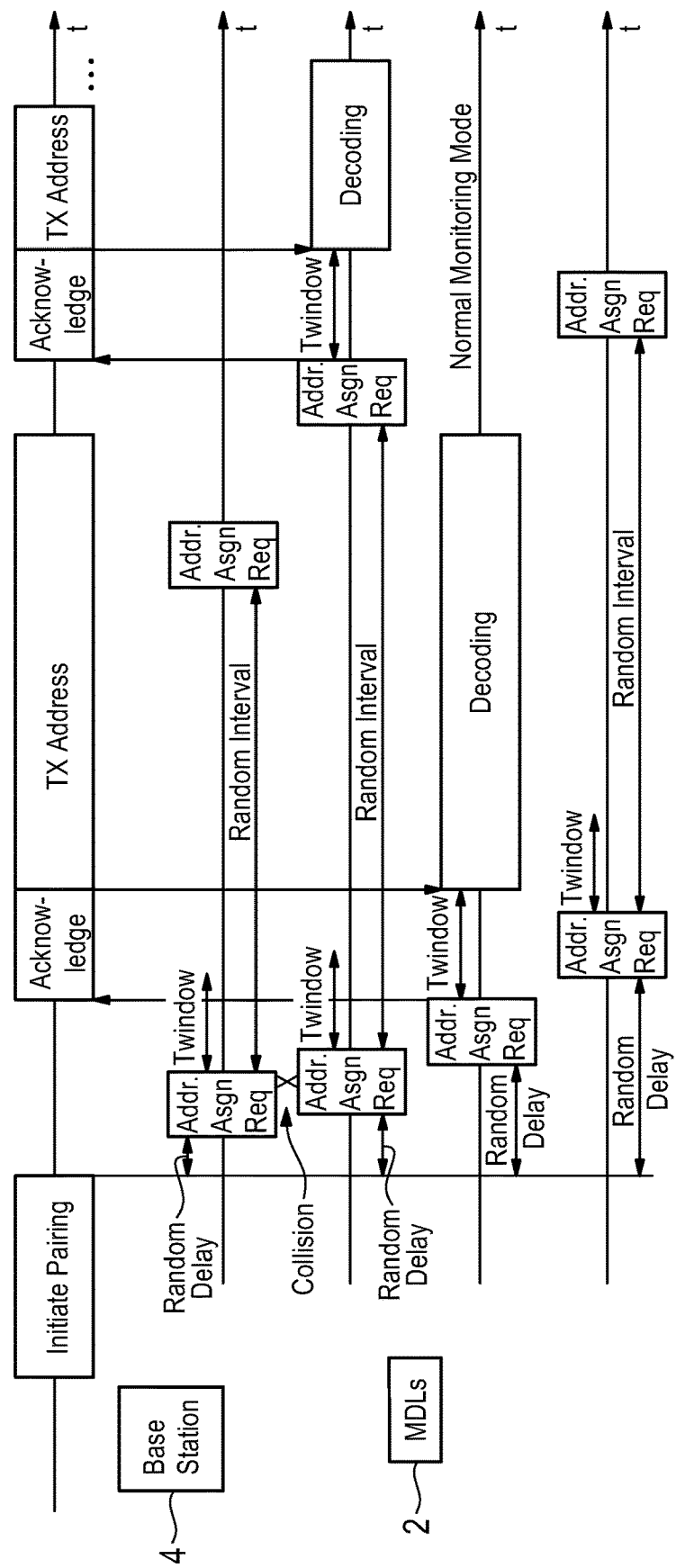
FIG. 17 shows a signal diagram for illustrating a possible exemplary embodiment of a pairing process which can be performed in a photovoltaic module level monitoring system according a further aspect of the present invention.
Figure 18:
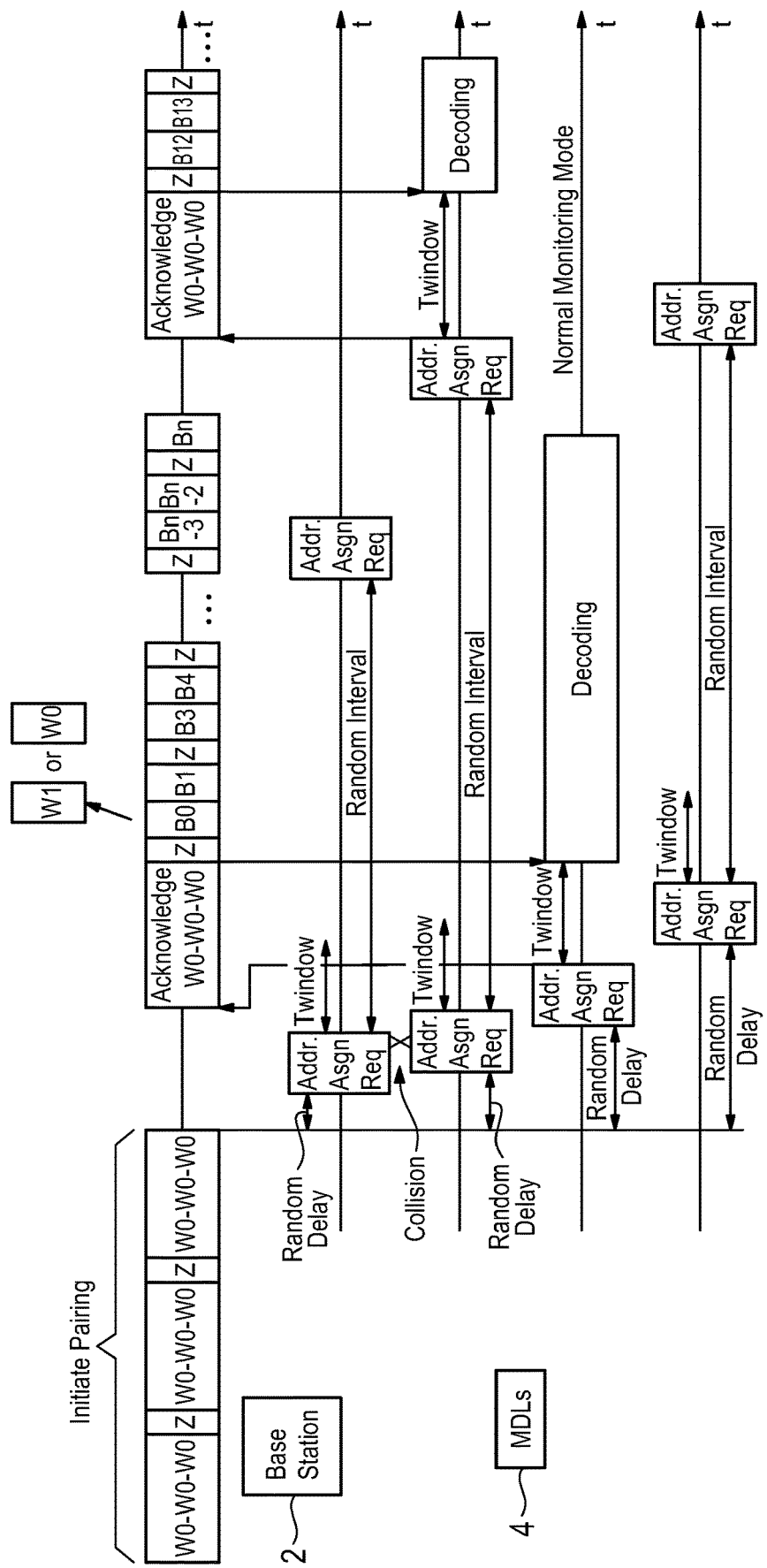
FIG. 18 shows a further signal diagram for illustrating a pairing process which can be performed in a photovoltaic module level monitoring system according to the present invention.

In a possible embodiment of the photovoltaic, PV, module level monitoring, MLM, system 1 as illustrated in FIG. 1, each module level device, MLD, 4 can comprise an assigned unique time slot address number defining a time slot, $TS_{MS}$, of the uplink channel, UL-CH, where the model level monitoring, MLM, transmitter of said module level device, MLD, 4 sends a monitoring signal, MS, generated by the respective module level device, MLD, 4 once per monitoring cycle. In a possible embodiment, the unique time slot address number is assigned to the respective module level monitoring device, MLD, 4 after installation of the photovoltaic, PV, module level monitoring, MLM, system 1 in a pairing process as illustrated in FIGS. 17, 18 and stored in a local memory of the model level device, MLD, 4.

In a possible embodiment, the base station transmitter of the base station, BS, 2 can be connected to a Rapid Shutdown, RSD, initiator and can be adapted to transmit a permission to operate, PTO, signal periodically in the downlink channel, DL-CH, when the Rapid Shutdown, RSD, initiator indicates that Rapid Shutdown RSD is not active and is further adapted to stop transmitting the permission to operate, PTO, signal when the initiator indicates that Rapid Shutdown is active. In a possible embodiment, the base station 2 of the photovoltaic module level monitoring, MLM, system 1 can be connected to a communication gateway via a wired or wireless data network.

Each module level device, MLD, 4 of the photovoltaic module level monitoring, MLM, system 1 as illustrated in FIG. 1 can be adapted to monitor and/or to control physical parameters of at least one associated photovoltaic module, PVM, 5. These physical parameters can include a current, I, a voltage, U, a temperature, T, and/or an energy, E, produced by the respective photovoltaic module, PVM, 5. Each module level device, MLD, 4 of the photovoltaic module level monitoring, MLM, system 1 can comprise in a possible embodiment a DC switch 4D used for switching on/off its associated photovoltaic module, PVM, 5 depending on the Rapid Shutdown, RSD, control signals, CS, received by the Rapid Shutdown receiver, RSD-RX, of the respective module level device, MLD, 4 via the downlink channel, DL-CH.

In the illustrated embodiment of FIG. 1, the base station, BS, 2 is integrated in an inverter 6 adapted to convert a DC power supplied by the photovoltaic modules, PVMs, via the power cables 3 through said inverter 6 into an AC current.

The base station 2 of the photovoltaic module level monitoring, MLM, system 1 as shown in FIG. 1 is adapted to send RSD control signals and MLM synchronization signals to the module level devices, MLD, 4 using powerline communication PLC through the PV cables 3 in a PLC downlink. The base station 2 is further adapted to receive monitoring data via the PLC uplink. The base station 2 can in a possible embodiment sort the data and can give access to the data through a communication gateway 2D via Ethernet, WiFi, Bluetooth or a cellular network.

The module level devices, MLDs, 4 are attached to associated photovoltaic modules 5 as shown in FIG. 1. The module level devices MLDs, 4 can monitor physical quantities such as current, voltage, temperature or energy production. The module level devices 4 can send back monitoring data using PLC to the base station 2 of the system 1. The module level devices 4 are adapted to receive and to decode Rapid Shutdown and/or MLM synchronization signals coming from the base station 2. The module level device 4 can further be adapted to generate an on/off control signal for the corresponding photovoltaic module DC switch 4D depending on the received RSD control signals.

The downlink channel, CL-CH, is directed from the base station 2 to the module level devices 4. In contrast, the uplink channel, UL-CH, is directed in the opposite direction pointing from the module level devices 4 to the base station 2. In a possible embodiment, the MLM communication provided within the photovoltaic, PV, module level monitoring, MLM, system 1 according to the present invention as illustrated in the embodiment of FIG. 1 is asymmetrical, i.e. monitoring data is transmitted on the uplink channel, i.e. from the module level devices 4 to the base station 2, and control signals are transmitted on the downlink channel, i.e. from the base station 2 to the module level devices 4.

The communication system illustrated in FIG. 1 allows for module level monitoring, MLM, but can be extended also to the collection of data from other devices connected to the DC line, i.e. the power cables 3. The photovoltaic module level monitoring, MLM, system 1 according to the present invention uses powerline communication, PLC, over the DC link between the photovoltaic array and a base station 2, e.g. a base station 2 which can be integrated in a PV inverter 6. In a possible embodiment, two different communication channels using S-FSK modulation can be implemented on the DC link. The downlink channel DL-CH can be used to send messages to the photovoltaic array including in particular SunSpec Rapid Shutdown RSD, Keep Alive Signals. In a possible embodiment, a set of eight words can be used on this channel in accordance with the SunSpec Rapid Shutdown specification. The uplink channel UL-CH can convey messages from the module level devices 4 to the base station 2. The base station 2 sends messages on the downlink channel DL-CH and is listening to the uplink channel UL-CH and gets messages if no collision occurs between them. The module level devices 4 can send messages on the uplink channel UL-CH. In a possible embodiment, the model level devices 4 are only listening to the downlink channel DL-CH and get synchronization messages.

FIG. 2 shows a block diagram for illustrating the asymmetrical MLM communication between the base station 2 and a monitoring level device, MLD, 4 of the system 1. As can be seen in FIG. 2, the base station 2 and the monitoring level device, MLD, 4 are connected to each other by means of a PLC downlink channel and a PLC uplink channel. The base station 2 comprises a base station transmitter 2A and a base station receiver 2B. The base station transmitter 2A is adapted to transmit Rapid Shutdown, RSD, control signals, CS, via the PLC downlink channel through said power cables 3 to the module level device 4 shown schematically in FIG. 2. Further, the base station receiver 2B of the base station 2 is adapted to receive monitoring signals, MS, generated by the module level device 4 through the power cables 3 within time slots, $TS_{MS}$, via the PLC uplink channel assigned to the module level device, MLD, 4. In the illustrated embodiment of FIG. 2, the base station transmitter 2A of the base station 2 is connected to a Rapid Shutdown, RSD, initiator 2C and is adapted to transmit a permission to operate, PTO, signal periodically in the downlink channel DL-CH, if the Rapid Shutdown, RSD, initiator 2C indicates that a Rapid Shutdown, RSD, is not active. The base station transmitter 2A is further adapted to stop transmitting the permission to operate, PTO, signal when the initiator 2C indicates that a Rapid Shutdown, RSD, is active. In the illustrated embodiment of FIG. 2, the base station 2 comprises further a monitoring gateway 2D. The base station receiver 2B can be connected to the communication gateway 2C in a possible embodiment via a wired or wireless data network.

The module level device, MLD, 4 comprises in the illustrated embodiment of FIG. 2 a module level monitoring, MLM, transmitter 4A and a Rapid Shutdown, RSD, receiver, RSD-RX, 4B. The module level monitoring, MLM, transmitter 4A is adapted to transmit a monitoring signal, MS, generated by the module level device, MLD, in a time slot, $TS_{MS}$, of the uplink channel, UL-CH, assigned to the module level device, MLD, 4 to the base station receiver 2B of the base station 2. The Rapid Shutdown, RSD, receiver, RSD-RX, 4B of the module level device, MLD, 4 is adapted to receive a Rapid Shutdown, RSD, control signal, CS, generated by the base station 2 in a time slot, $TS_{CS}$, of the downlink channel, DL-CH. In a possible embodiment, the module level device, MLD, 4 is adapted to monitor physical parameters of at least one associated photovoltaic module 5 such as a current, a voltage, a temperature or a produced energy. In a possible embodiment, the module level device, MLD, 4 can comprise sensors 4C providing data concerning physical parameters of the associated photovoltaic module, PVM, 5. In a possible embodiment, each module level device, MLD, 4 can comprise a DC switch 4D which can be used for switching on/off its associated photovoltaic module, PVM, 5 depending on the Rapid Shutdown, RSD, control signals, CS, received by the Rapid Shutdown, RSD, receiver, RSD-RX, 4B of the module level device, MLD, 4 via the downlink channel, DL-CH.

In the illustrated exemplary embodiment of FIG. 2, the downlink channel, DL-CH, can allow a transmission of eight different commands coded on three bits each second, while the uplink channel, UL-CH, transmits 96 useful bits per second. In the illustrated exemplary embodiment, the MLM communication within the module level monitoring, MLM, system 1 is asymmetrical wherein the payload in the PLC downlink channel DL-Ch is transported at a lower rate than the payload in the PLC uplink channel UL-CH. The main function of the Rapid Shutdown, RSD, command signals is a possible disconnection of each photovoltaic module, PVM, 5 from the photovoltaic strings in the absence of a permission to operate, PTO, signal. The PTO signal is sent in a possible embodiment periodically, for instance each second.

Table 1 below illustrates a possible definition of different RSD symbols and their use as MLM control signals within the photovoltaic, PV, module level monitoring, MLM, system 1 according to the present invention.

| Code | RSD Function | PTO | Implementation | Monitoring Function |
|---|---|---|---|---|
| 1-1-1 | PTO—Permission to Operate | YES | Mandatory | Synchronization |
| 0-0-0 | ASD—Accelerated Shut-down | NO | Optional | Synchronization |
| 0-0-1 | — | NO | Reserved | — |
| 0-1-0 | — | NO | Optional | Monitoring Cycle Start |
| 0-1-1 | — | No | Reserved | — |
| 1-0-0 | — | No | Reserved | — |
| 1-0-1 | Alternative PTO | YES | Optional | Monitoring Cycle Start |
| 1-1-0 | Alternative PTO | YES | Reserved | — |

Table 1 can be represented in a more comprehensive way as follows:

| | | RSD Function | |
|---|---|---|---|
| | | Synchronization | Cycle Start |
| MLM Function | PTO | 1-1-1 | 1-0-1 |
| | No PTO | 0-0-0 | 0-1-0 |

Figure 3:
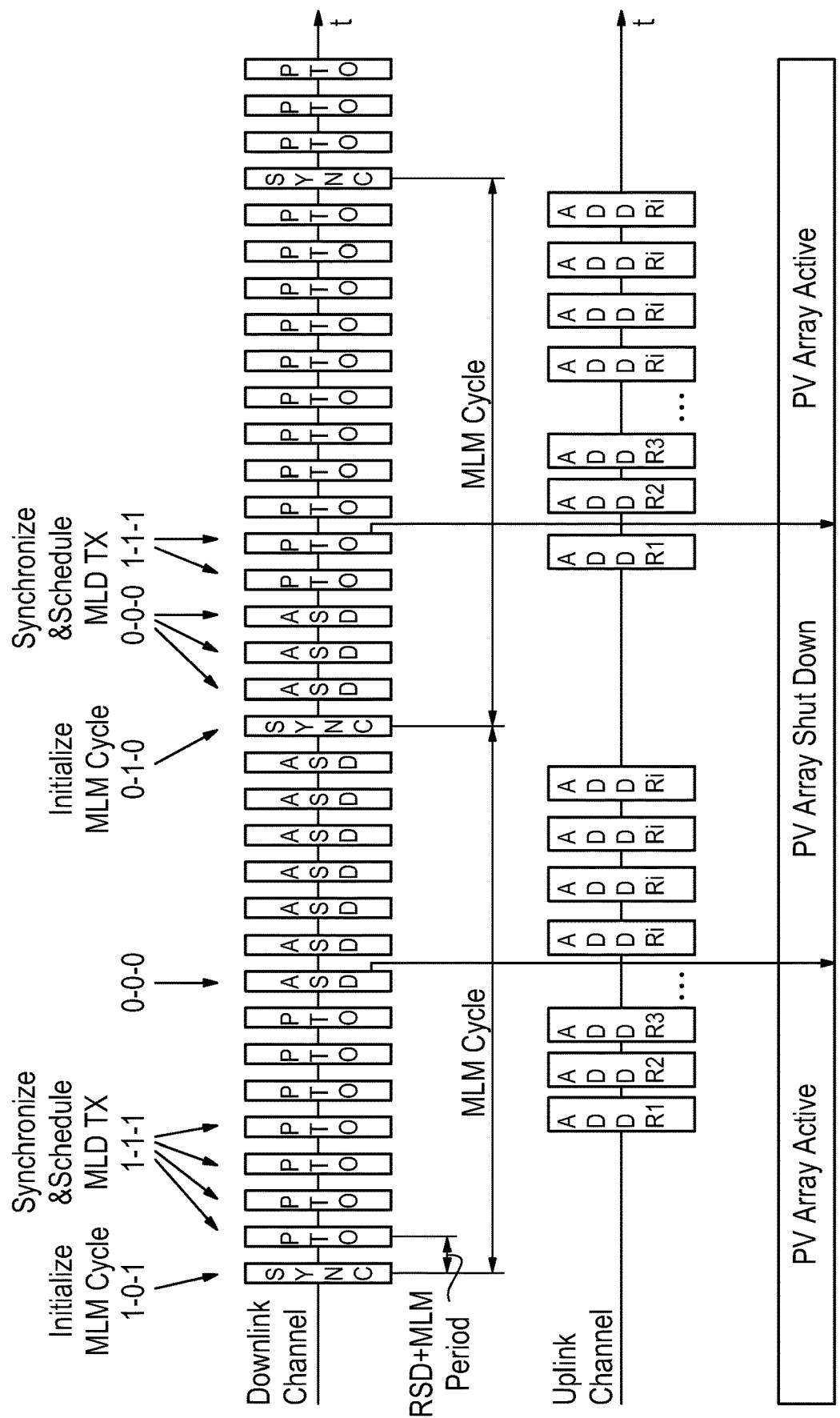
FIG. 3 shows a signalling diagram for illustrating the communication within a photovoltaic module level monitoring system according to the present invention.

The four codes illustrated in Table 2 can be used in the MLM system 1 as illustrated in the signal diagram of FIG. 3. After an initialization command, the base station 2 can send RSD command signals with approximately one second periods. Each module level device, MLD, 4 comprises in a preferred embodiment a unique number defining a time slot TS in which the module level device MLD can send monitoring data, e.g. once per monitoring cycle. This scheme assures the compatibility of the downlink signaling with the SunSpec RSD system. As both the 111 code and the 101 code contain a permission to operate, PTO, message, they are used when the RSD system activates the photovoltaic modules, PVM, 5. On the contrary, when the photovoltaic modules, PVM, 5 have to be shut down, the 000 code and 010 code (not including a PTO message) are sent assuring the continuity of the MLM operation.

As also illustrated in FIG. 4, the downlink channel, DL-CH, used for the transmission of the Rapid Shutdown, RSD, control signals, CS, within predefined time slots, $TS_{CS}$, and the uplink channel, UL-CH, used for transmission of the monitoring signals, MS, within predefined time slots, $TS_{MS}$, are synchronized to each other. In the embodiment illustrated in FIG. 4, the time slots, $TS_{MS}$, of the uplink channel, UL-CH, assigned to module level devices, MLDs, 4 are shorter and located inside the predefined time slots, $TS_{CS}$, of the downlink channel, DL-CH. In the illustrated specific implementation illustrated in FIG. 4, the length of the time slots, $TS_{MS}$, of the uplink channel, UL-CH, is 153.60 msec and is shorter than the length of the predefined time slots, $TS_{CS}$, of the downlink channel, DL-CH, having a length of 168.96 msec in the illustrated specific implementation shown in FIG. 4. To assure that the monitoring signal, MS, does not disturb the quiet period of the RSD signal, the illustrated monitoring protocol uses time slots $TS_{MD}$ that are shorter than the time slots used for the RSD command signals, wherein the time slots are synchronized with each other. Further, frequency division multiplexing, FDM, can be used to separate the two signals, i.e. these signals are modulated at different frequencies.

In order to occupy the narrowest frequency band possible, the FSK (frequency shift key) frequency used on the uplink channel UL-CH and the downlink channel DL-CH can be in the same frequency band, close to each other. The module level monitoring, MLM, signaling and the Rapid Shutdown, RSD, signaling can be performed simultaneously. In a possible embodiment, a separation of the received signal from the transmitted signal can be achieved by transmission of signals which comprise low side lobes in the spectrum falling in the received channels. The FSK switching performed between two carrier frequencies generates high side lobes that can be decreased in a preferred embodiment by baseband pulse shaping. In a possible embodiment, the modulation bandwidth occupied by the modulated Rapid Shutdown, RSD, control signal, CS, transmitted through the power cables 3 in the downlink channel, DL-CH, and the modulated monitoring signal, MS, transmitted simultaneously through the power cables 3 in the uplink channel, UL-CH, can be reduced by baseband, BB, pulse shaping.

Figure 19:
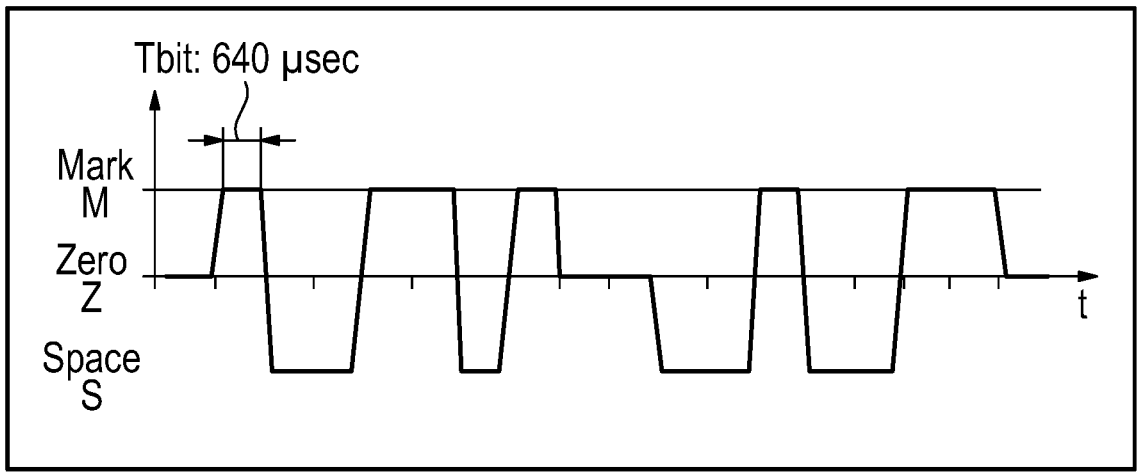
FIG. 19 illustrates a FSK switching which can be used by the system according to the present invention in a possible implementation.

In a possible embodiment, the uplink (MLD 4 to base station 2) modulation comprises S-FSK, i.e. a binary modulation comprising the transmission of two symbols "mark" and "space" with zero periods in-between as also illustrated in FIG. 19.

Figure 12:
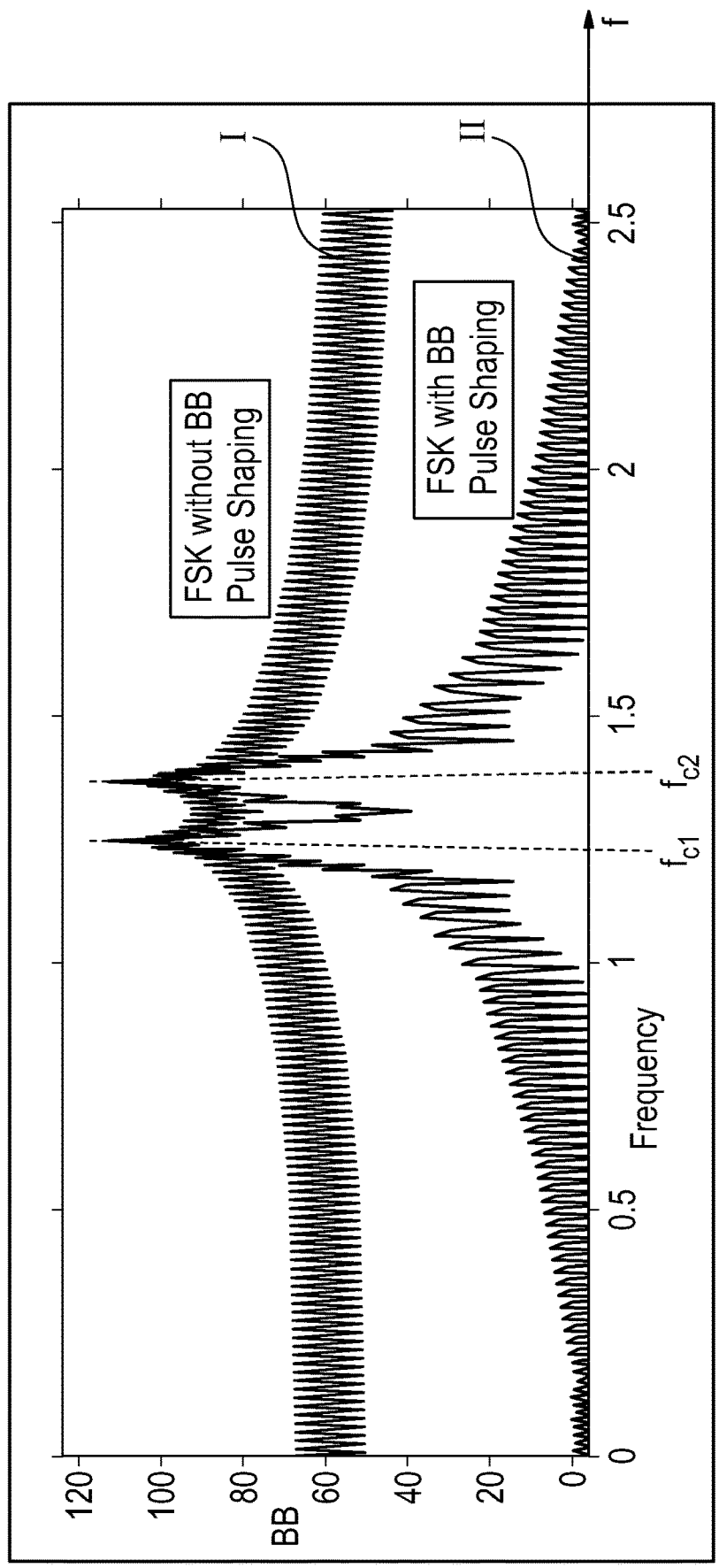
Figure 20:
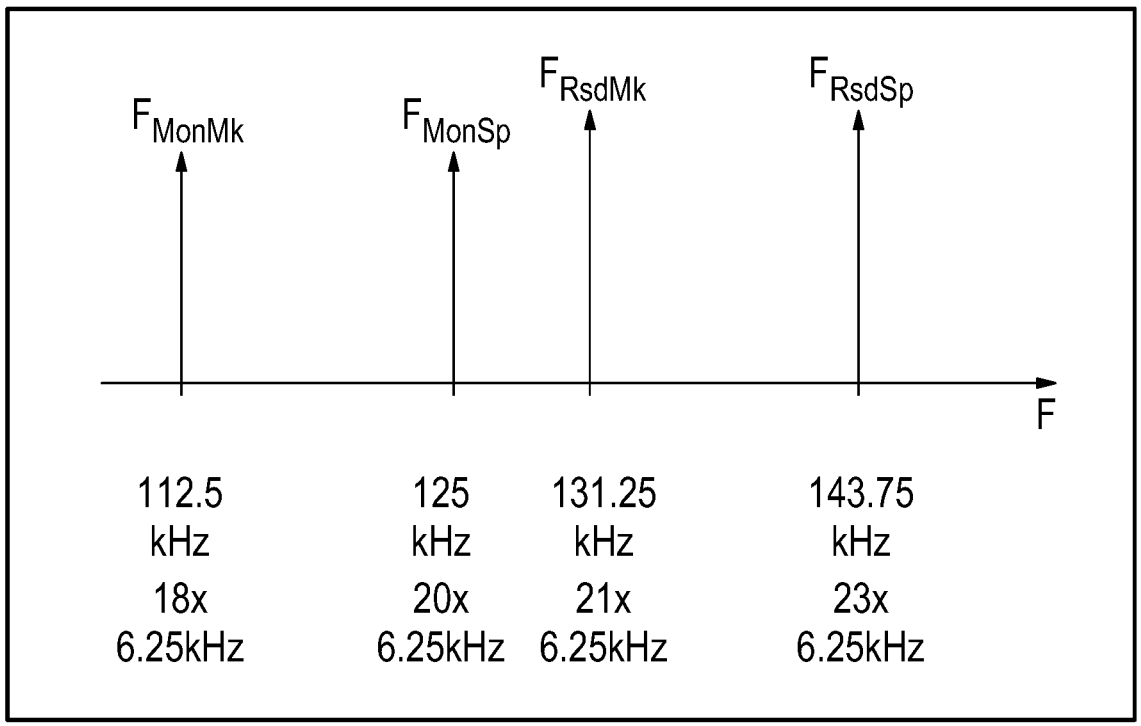
FIG. 20 illustrates MLM and RSD FSK carrier frequencies which can be used by the system according to the present invention in a possible embodiment.

FIG. 20 shows an exemplary implementation for MLM and RSD S-FSK carrier frequencies which may be used by the photovoltaic module level monitoring, MLM, system 1 of the present invention. The MLM "mark" and "space" frequencies $F_{MONM}$ and $F_{MOMSP}$ can be on the same 6.25 kHz raster than the RSD frequencies $F_{RSDMK}$ and $F_{RSDSP}$. In a simple implementation of the S-FSK modulation, a switching between two carrier frequencies is performed. However, this does result in a wide spectrum I as also illustrated in FIG. 12. A wide spectrum is not desirable when operating two systems with frequencies close to each other like RSD and MLM. Further the wide provides spectrum can cause IMI problems.

Figure 5:
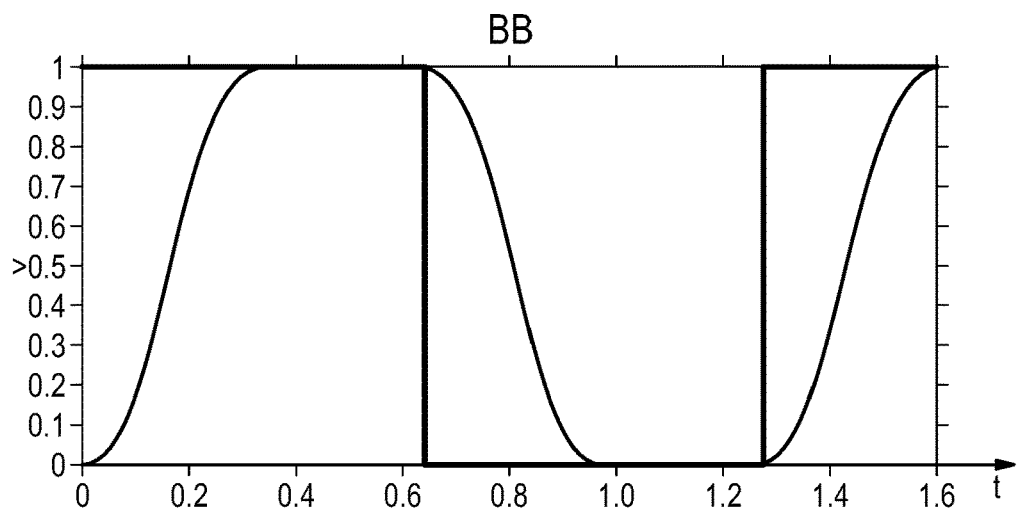
FIGS. 5 to 12 illustrate the reduction of a modulation bandwidth occupied by control signals by baseband pulse shaping in an possible exemplary embodiment of the photovoltaic module level monitoring system according to the present invention.

In order to narrow down the occupied spectrum, smooth transitions can be added between the different symbols. The resulting spectrum is also illustrated in FIG. 12. To keep the modulation simple, the transmission width can be limited to one half of the symbol period as shown in FIG. 5. The mark and space transition curves are complementary, i.e. their sum is constant. This does guarantee that the RF amplitude does not exceed the nominal value, i.e. there is not risk of saturating a power amplifier PA.

In a possible embodiment, the generation of the RF signals includes baseband, BB, pulse shaping comprising several steps.

In a first step S1, a periodic 0101 . . . baseband, BB, binary signal is over-sampled and processed by an FIR filter. The FIR filter can comprise a finite response length, e.g. 319 μsec.

Figure 6:
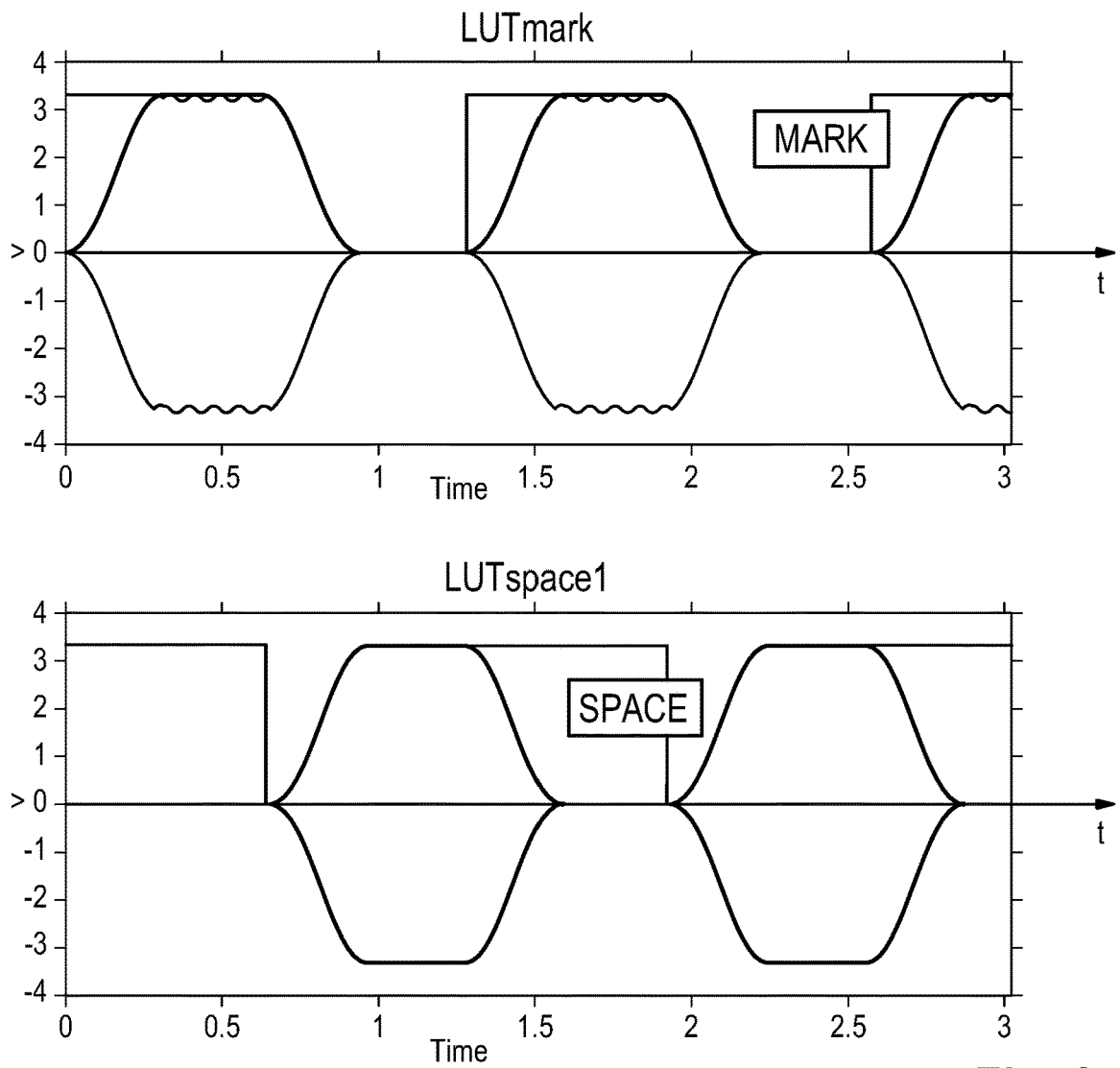

The mark signal M and the zero/mark (Z/M) and mark/zero (M/Z) transitions can be generated by multiplying in a second step S2 the envelope with sine waves that have periods corresponding to the carrier frequencies as also illustrated in FIG. 6.

Figure 7:
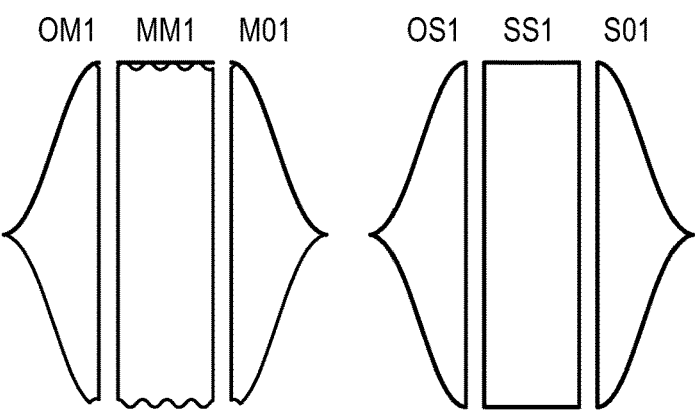

A reference modulated signal can be cut in a further step S3 into equal length pieces and stored in a reference look-up table LUT. Their length can be a sub-multiple of the bit period $L_{bit}$. For example, it can be one half of the bit period $L_{bit}$ as illustrated in FIG. 7, if the FIR filter response is shorter than or equal to one half of the bit length. With a proper choice of the carrier frequencies and length of the reference look-up tables LUTs, it can be assured that all reference look-up tables R-LUTs comprise values beginning with a zero value, i.e. there is no phase jump when the signal segments are linked together one after the other. FIG. 7 illustrates a complete set of look-up tables LUTs which can be combined to build any FSK sequence. OM1, MM1 and MO1 are the mark signal components wherein a separate single mark symbol can be created by concatenating them. The signal components OS1, SS1 and SO1 comprise space components. The transitions between mark M and space S can be generated by summing the adequate mark and space components stored in the look-up tables LUTs, i.e. MS1=MO1+OS1, SM1=SO1+OM1. To complete the set 00 is a series of a predetermined number of zero values, wherein the number is e.g. 320.

Figure 8:
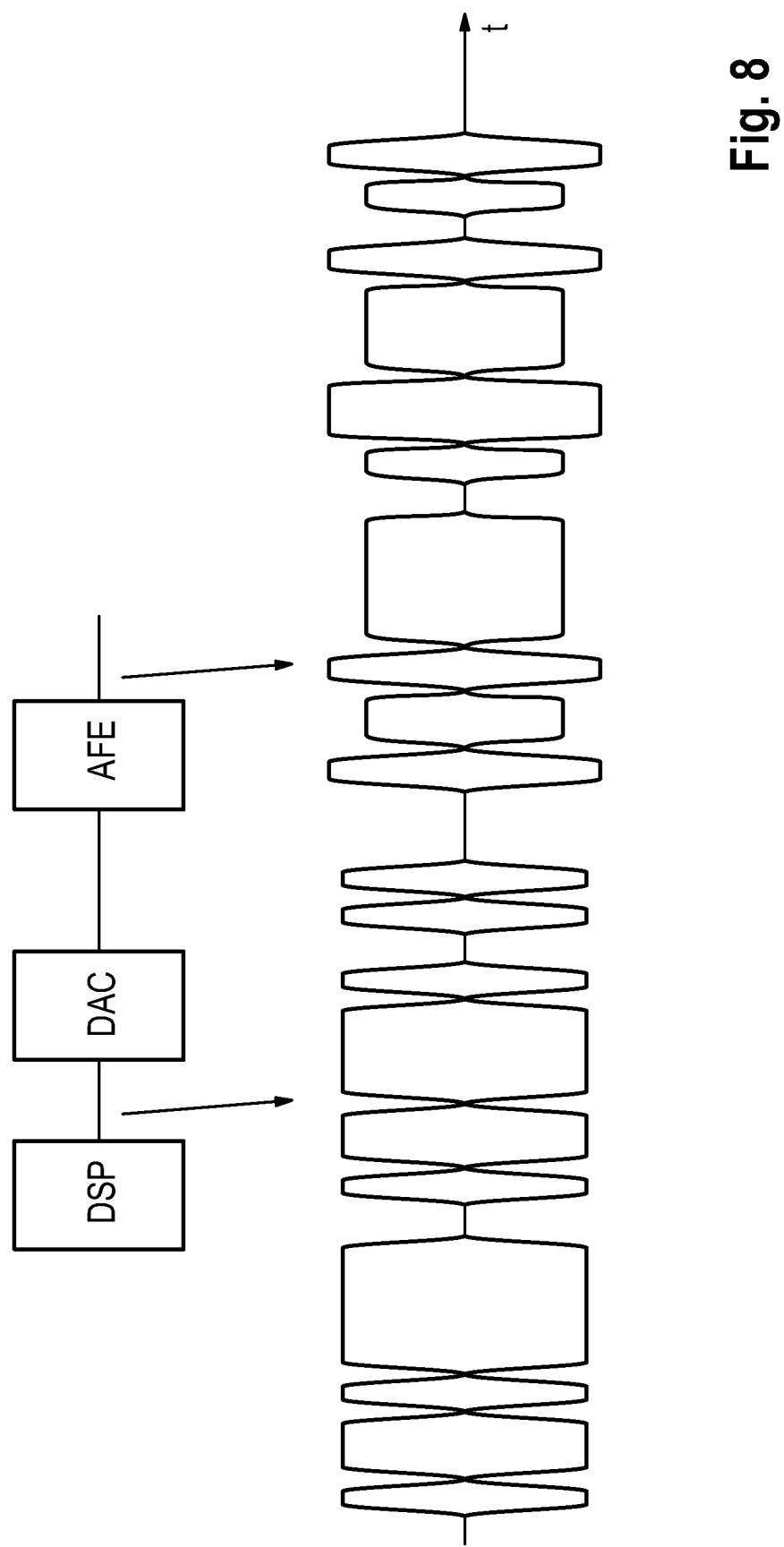

The signal components stored in the look-up tables LUTs can be used if the gain of the transmission TX chain comprises a low dispersion and is identical for both carrier frequencies. However, in practical circuits, the gain can have a tolerance as high as +/−20% and up to +/−20% so that a difference may occur between the amplitudes of the two carriers at the output as also illustrated in FIG. 8. Accordingly, the gain of the transmission chain is not necessarily equal for the two carrier frequencies resulting in an amplitude change when passing from one carrier frequency to the other carrier frequency as illustrated also in FIG. 8.

In a possible embodiment, this mismatch can be corrected by calibration or by using predefined coefficients determined by characterization in step S4. The amplitudes of the two carrier frequencies can be measured at the analog frontend AFE output and compared to the nominal values of the km and ks parameters.

The km and ks parameters can be calculated as follows:

$$Km = A_{MARK\_NOMINAL}/A_{MARK\_MEASURED}$$

$$ks = A_{SPACE\_NOMINAL}/A_{SPACE\_MEASURED}.$$

The km factor and the ks factor can be stored in a non-volatile memory and can be applied to a basic look-up table LUT during each startup to compensate the TX chain transfer characteristics.

Figure 9:
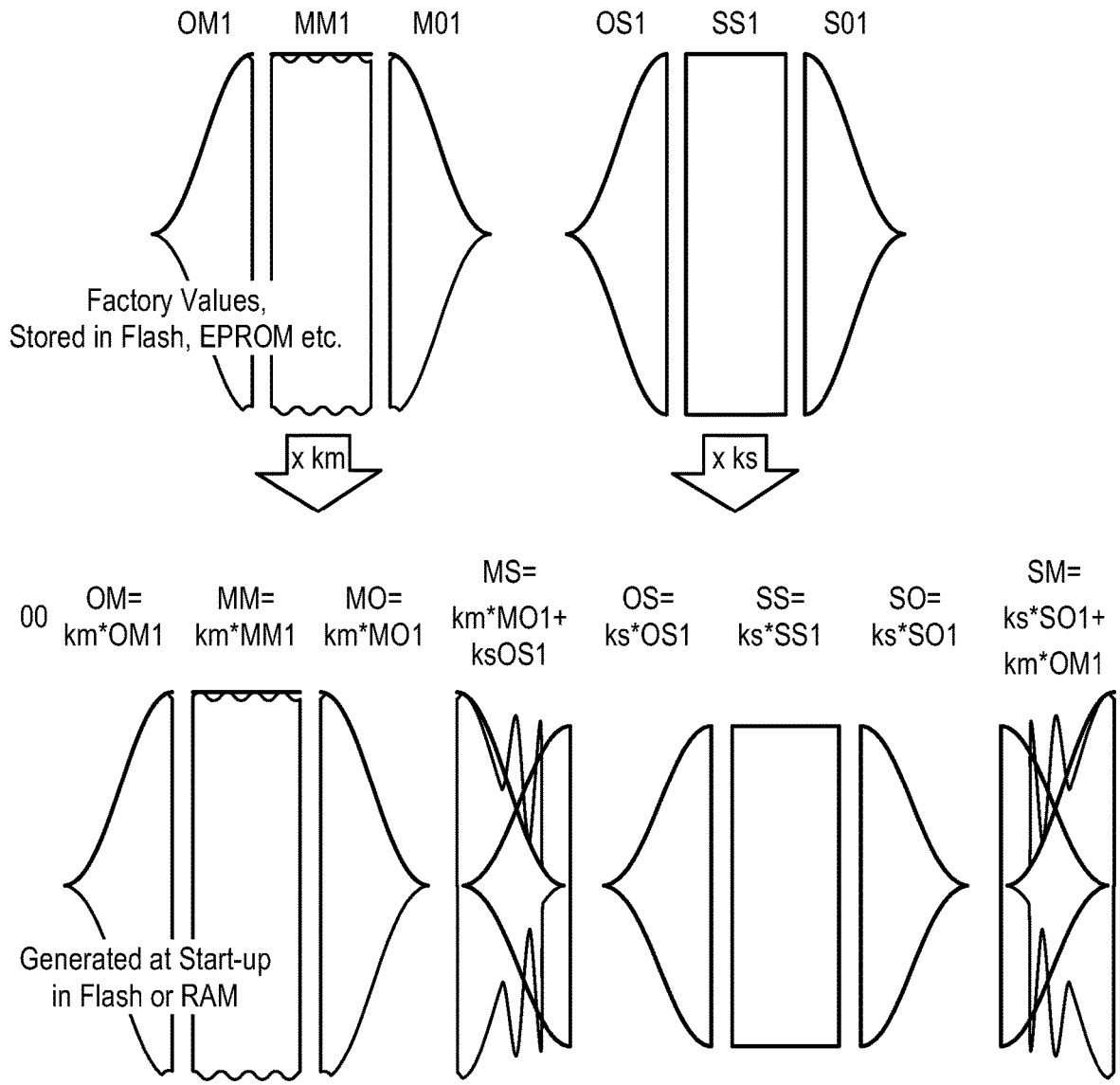

At the end of the calibration process or at each startup of the monitoring level device, MLD, 4 nine functional look-up tables LUTs can be generated in step S5 by applying the km and ks factors to the six reference look-up tables R-LUTs and by combining them as illustrated in FIG. 9. FIG. 9 shows the look-up table values with amplitude compensation. Any transmit sequence can be generated or built using these functional LUTs. As illustrated in FIG. 1, the km and ks equalizing factors can provide equal amplitudes at the two carrier frequencies.

Figure 10:
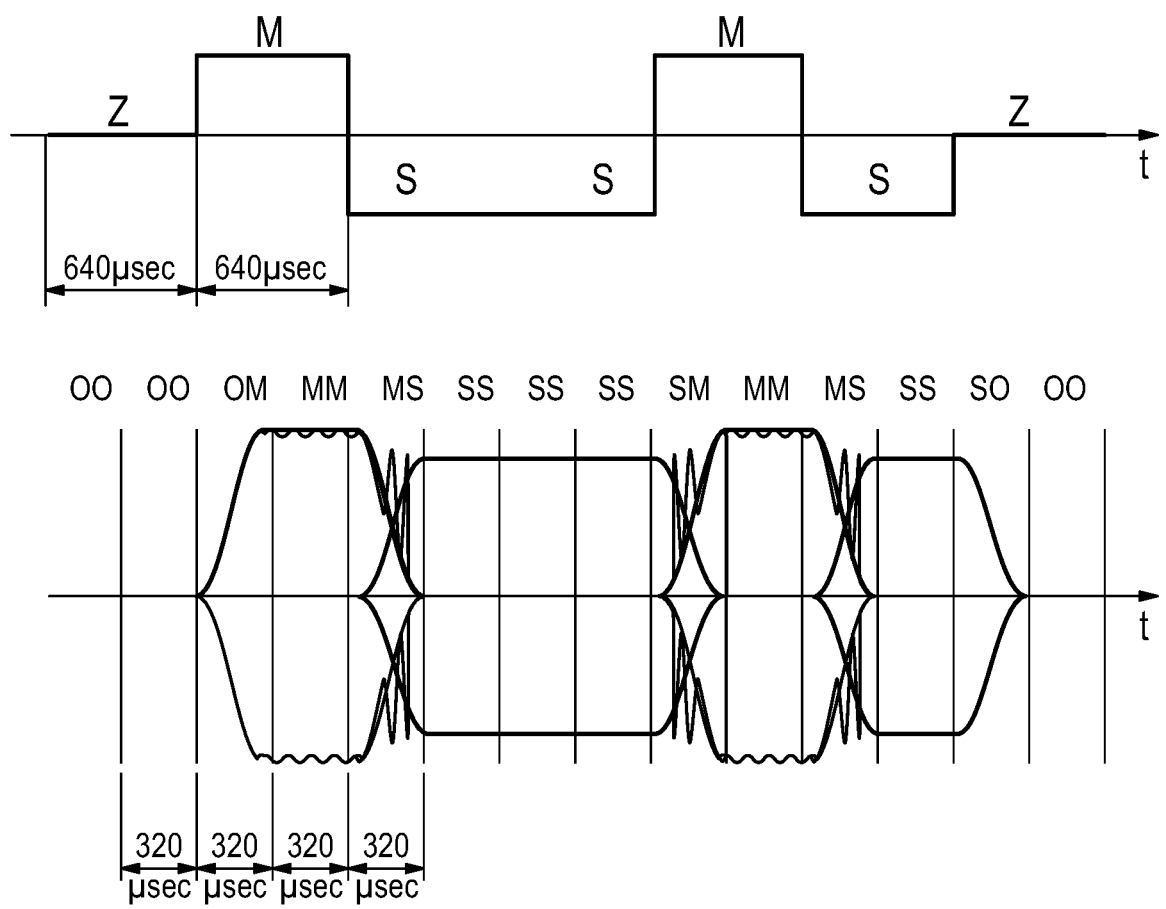
Figure 11:
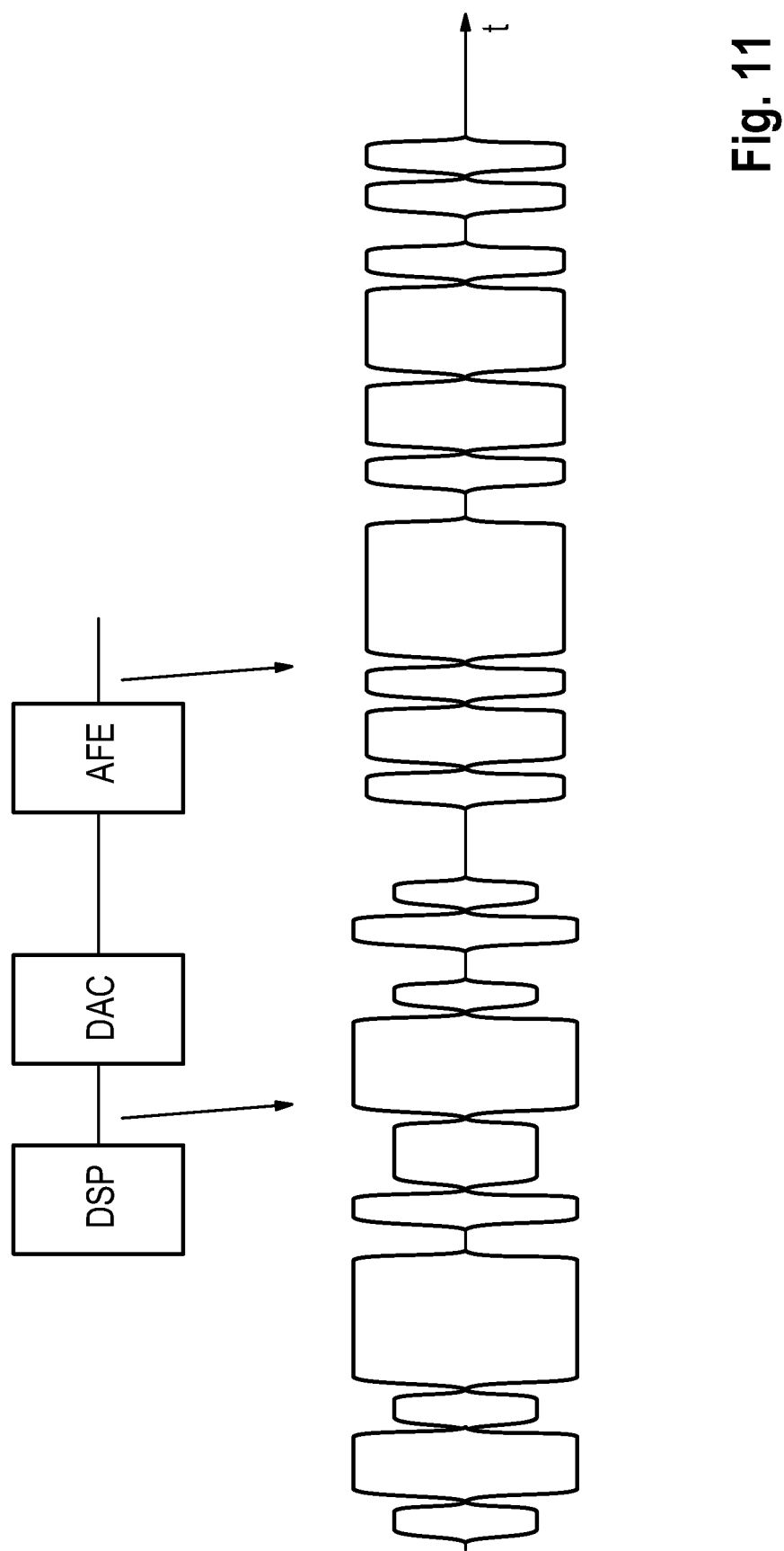

In a possible embodiment, transmit sequences can be assembled in real-time in a step S6 using these functional LUTs. In a possible embodiment, the functional LUTs can be read from a memory and fed to the DAC using DMA. Consequently, only limited MCU resources are involved. A TX sequence can be built or generated in this way as illustrated in the example of FIG. 10. In the illustrated embodiment, the bit length is 640 µsec and the functional LUTs comprise 320 samples (using 1 Msps sampling rate). As also illustrated in FIG. 11, the km and ks equalizing factors assure equal amplitudes at both carrier frequencies at the AFE output.

The efficiency of this baseband (BB) pulse shaping process is also illustrated in the spectrum shown in FIG. 12. The FSK modulated RF signal with BB pulse shaping (II) comprises 30 to 40 dB lower side lobes close to the carrier frequencies $fc_1$, $fc_2$ than the FSK modulated RF signal without BB pulse shaping (I).

Figure 13:
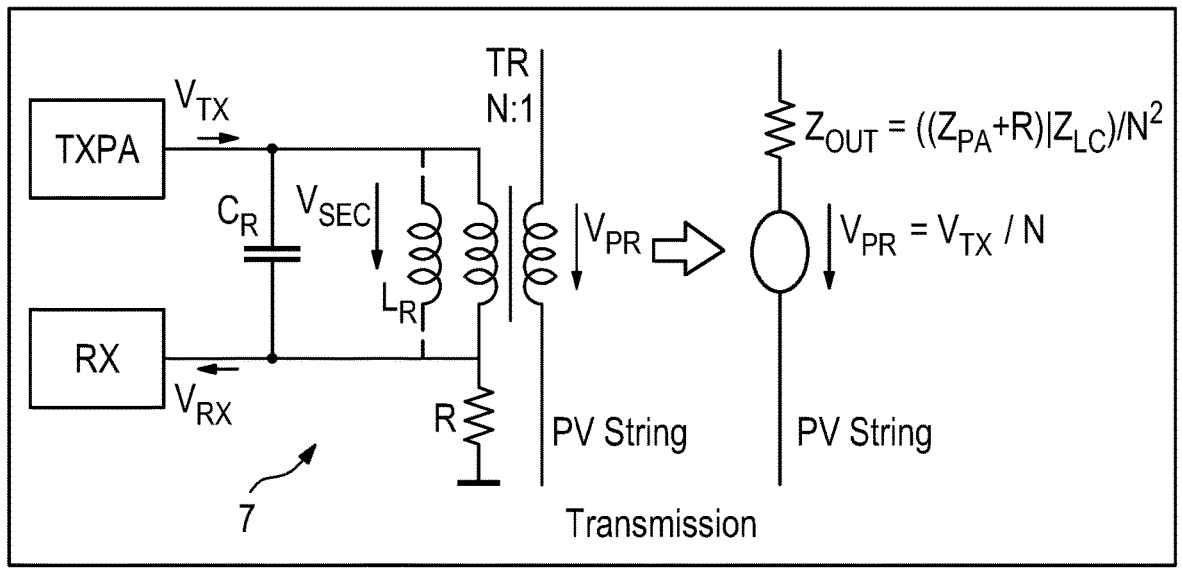
FIG. 13 shows a circuit diagram for illustrating a possible coupling to a DC power network according to a possible exemplary embodiment of the photovoltaic module level monitoring system according to the present invention.

In a possible embodiment of the photovoltaic module level monitoring, MLM, system 1 according to the present invention, the transmitter and receiver of the base station 2 as well as the transmitter and receiver of each module level device 4 are connected to each other through power cables 3 of the DC power network and are coupled to the DC network by means of a duplexer circuit 7 as also illustrated in FIGS. 13 to 16. The duplexer circuit 7 comprises in a preferred embodiment a high-current transformer TR adapted to isolate the transmitter from the respective receiver. The high-current transformer TR can comprise a maximum thermal and saturation DC current at its primary winding (PV string side) higher than the maximum string current. As illustrated in FIG. 13, the duplexer circuit 7 comprises a resonator circuit including a capacitor $C_R$ and an inductance $L_R$ connected in parallel to the secondary winding of the high-current transformer TR. The high-current transformer TR has a primary winding within the PV string as shown in FIG. 13. The capacitor $C_r$ forms the resonator circuit with the $L_r$ effective secondary side inductance around the RX and TX FSK frequencies. A resistor R connected to the resonator circuit provides the input node for the RX channel.

The operation of the coupling duplexer circuit illustrated in FIG. 13 is described in the following for the transmission (TX) and reception (RX) of a signal.

For transmission, a power amplifier PA generates an RF signal that is injected via the high-current transformer TR into the PVM string as a serial voltage $V_{TX}$. The voltage $V_{PR}$ in the primary winding of the high-current transformer TR is determined by the output voltage of the power amplifier PA and the transformer winding ratio N. As the output impedance of the power amplifier PA is generally much lower than the resistance of the resistor R, the output impedance $Z_{OUT}$ is mainly defined by the resistance of the resistor R divided by $N^2$. If the resonator circuit is designed to have an impedance well above the resistance of the resistor R, the amplitude of the transmission signal injected into the RX channel is mainly determined by the string impedance $Z_{STR}$ of the pv string:

$$V_{RX} \cong V_{Tx} * R/(R + Z_{PA} + N * Z_{STR})$$

For example, with N=2, $Z_{STR}$=20 ohm, R=4 ohm, the voltage $V_{RX}$ is $V_{TX}$*0.05, i.e. there is a 26 dB attenuation between the TX output and the RX input at the resonance frequency $f_R$ of the resonance circuit.

Figure 14:
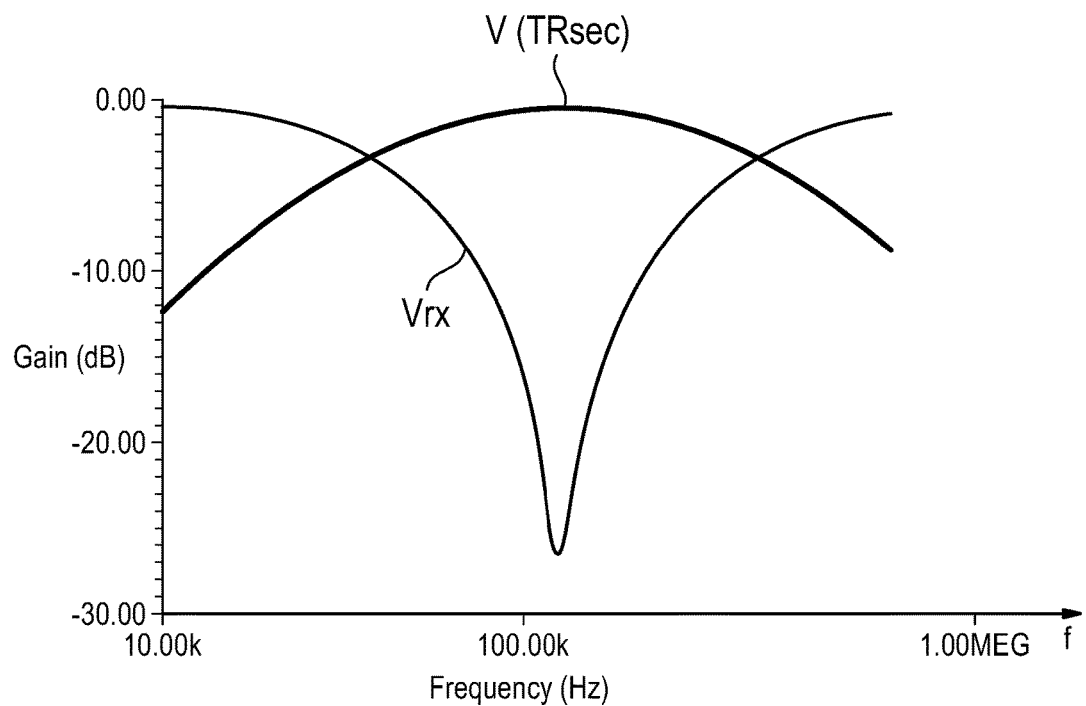
FIG. 14 shows a diagram for illustrating AC simulation results for the coupling illustrated in FIG. 13.

FIG. 14 shows a signal diagram to illustrate AC simulation results for a coupling duplexer circuit 7. As can be seen, the TX attenuation is less than 0.5 dB in the RSD FSK frequency bands (131 to 144 kHz). Further, it can be seen that the RX attenuation is better than 20 dB in the same frequency band.

During reception (RX), the signal received from the PV string passes through the high-current transformer TR to the resonance circuit. Since the output impedance $Z_{PA}$ of the power amplifier PA is lower than the resistance of the resistor R the voltage $V_{RX}$ is roughly identical to $V_{SEC}$ on the secondary side of the transformer TR, i.e. the RX signal loss is negligible. This is also illustrated in FIG. 15.

Figure 15:
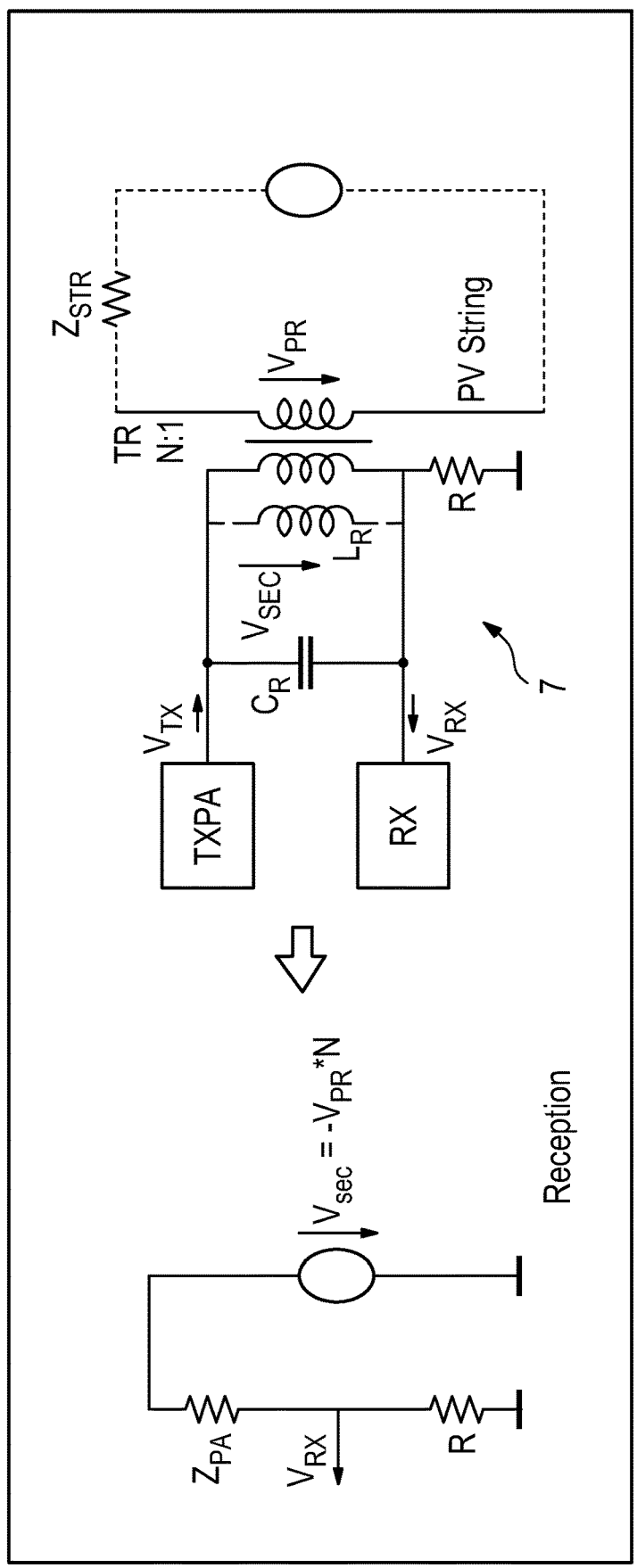
FIG. 15 shows a further circuit diagram for illustrating a possible exemplary embodiment of a coupling to a DC power network according to a further exemplary embodiment of the photovoltaic module level monitoring system according to the present invention.
Figure 16:
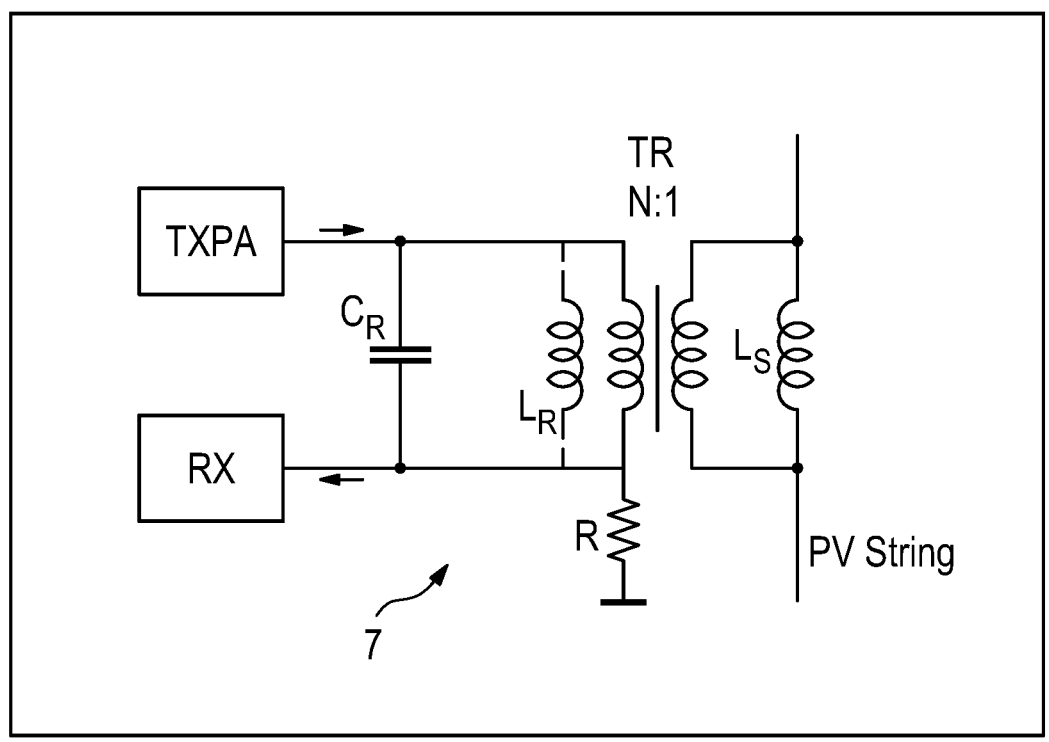
FIG. 16 shows a further circuit diagram for illustrating a possible exemplary embodiment of a coupling to a DC power network according to a possible exemplary embodiment of the photovoltaic module level monitoring system according to the present invention.

In an alternative embodiment, the high-current transformer TR as illustrated in the embodiments of FIGS. 13, 15 can be replaced by a high-current inductor $L_S$ and a small signal transformer TR as also illustrated in the circuit diagram of FIG. 16.

As also illustrated in the signal diagram of FIG. 3, the module level devices, MLDs, 4 transmit one after the other in a time slot TS defined by a pre-programmed TX address unique to each module level device, MLD, 4. In a possible embodiment, the unique TX address is assigned to each module level device, MLD, 4. In a possible embodiment, each module level device, MLD, 4 can be programmed accordingly before installation or before connecting the module level device to the PV string. However, this implementation requires additional equipment. Further, since the number of PVM modules 5 can be considerable in a single photovoltaic array, a programming of the MLD devices 4 during setup requires considerable time. Accordingly, in a preferred embodiment of the photovoltaic module level monitoring system 1 according to the present invention, a unique time slot address number is assigned to the respective module level monitoring device, MLD, 4 after installation of the photovoltaic, PV, module level monitoring, MLM, system 1 in a pairing process and stored in a local memory of the module level device, MLD, 4.

In a pairing process or pairing mechanism, a unique TX address is assigned automatically to each module level device, MLD, 4 in a photovoltaic array after installation. A possible embodiment of the pairing process is illustrated in FIG. 17.

After physical installation and connection of the photovoltaic modules 5 and potentially other instruments to the photovoltaic strings, the base station 2 can send an initiate pairing signal as shown in the signal diagram of FIG. 17. This initiate pairing signal is sent on the downlink channel DL-CH to the different module level devices, MLD, 4 of the DC power loop.

The module level devices, MLDs, 4 begin to transmit "Address Assignment Request"-signals with randomized timing as also shown in FIG. 17.

When the base station 2 does receive and successfully decode an "Address Assignment Request"-signal, i.e. if there is no collision between the randomly transmitted MLD signals, the base station 2 can emit an "Acknowledgement ACK code" followed by a "TX Address" as shown in FIG. 17. The first TX address is "1" and can be incremented after each assignment.

Further, the module level device, MLD, 4 that receives an "Acknowledge ACK" immediately after its request does decode the "TX Address" and can store it in a local memory. The respective MLD device 4 does stop to send assignment requests and can go into a normal monitoring mode, where it does wait for synchronization signals. Those module level devices, MLDs, 4 that do not receive the "Acknowledge" code from the base station 2 in good timing, i.e. immediately after their respective request, do not take it into account. Consequently, the "TX Address" is decoded by one and only one module level device, MLD, 4.

In the absence of an acknowledgement ACK with proper timing, the module level devices, MLDs, 4 do continue to send "Address Assignment Request" signals with randomized intervals.

The pairing process does stop when all module level devices, MLDs, 4 have got their TX Address. This can be determined in two different ways. Either the base station 2 does know in advance the number of module level devices, MLDs, 4 within the power loop to provide with an address or the base station 2 does detect a period of a predefined length during which there is no more "Address Assignment Request" coming from the module level devices, MLDs, 4.

After a successful pairing process, all module level devices, MLDs, 4 are in a normal monitoring mode and wait for synchronization signals transmitted by the base station 2. In contrast, if the pairing process is not performed correctly, it can be restarted using the initiate pairing signal output by the base station 2.

There can be some special features that make the integration of the pairing process as illustrated in FIG. 17 easier in the case of a module level monitoring, MLM, system 1 coexisting with Rapid Shutdown RSD as illustrated in FIG. 18.

The base station 2 can use the same modulation with the same carrier frequencies fc as used in the RSD transmission. Further, it is possible to use the same line-coding as in RSD, e.g. Barker-11 code with a chip length of 5.12 msec. As the RSD code triplets of the downlink channel DL-CH may not be sufficient for the pairing process (or the pairing process could take too much time using those triplets), some modifications can be performed to accelerate the pairing process. In a possible embodiment, the one second period is not applied between the codes, i.e. they follow directly each other without a pause. Further, in order to avoid that the module level devices, MLDs, 4 do interpret any portions of the downlink messages as PTO codes, only W0-W0-W0 triplets (RSD: Accelerated Shut-down) can be used in the initiate pairing signal and acknowledgement signals. Further, Z (no signal) periods can be inserted after each pair of binary codes to avoid an accidental generation of triplets with PTO contents. Accordingly, the pairing process as illustrated in FIG. 18 is in particular compatible with RSD.

The pairing process does assign the unique PLC address to each module level device, MLD, 4. The assigned address is used during the monitoring period to distribute time slots TS and thus avoids collisions of the uplink channel. By using a PLC address at the initial setup of the photovoltaic installation each module level device, MLD, 4 can send the address assignment request on the uplink channel UL-CH. Then, the module level device, MLD, 4 waits for a response from the base station 2 in a specific time window. This window can be defined in a way that the base station 2 responds only to non-colliding requests. The pairing operation or process is done only once on a given photovoltaic array during commissioning of the photovoltaic installation. For safety purposes, a permission to operate, PTO, signal is not sent during the pairing process. Therefore, the photovoltaic modules and the MLD cluster can stay in a stand-by mode.

Before getting a unique PLC address, the module level devices, MLDs, 4 cannot avoid collisions in the uplink channel UL-CH because they do not listen to other module level devices, MLDs, 4. To prevent an overload on the channel, the address assignment requests are sent randomly in a possible embodiment and when no collision occurs, the base station 2 does receive the requests from the module level device, MLD, 4 and does initiate a response. The way to send requests randomly can use different strategies in order to reduce the total pairing time required by the pairing process.

In a possible embodiment, additional security can be implemented to assure that a specific module level device, MLD, 4 does not receive a base station assignment response that is not linked to its request (i.e. to prevent any conflict during the monitoring stage and any error in the address assignment process). When a module level device, MLD, 4 does send an address assignment request, it does wait for an acknowledgement from the base station 2 in a specific time window. The base station 2 does respond with an acknowledgement only to requests that can be de-coded properly. This means that the base station 2 does not respond if there is a collision between two or more requests having comparable amplitudes.

As also illustrated in FIG. 17, to start the pairing process a specific initiate pairing message can be broadcasted through the downlink channel DL-CH to all module level devices, MLDs, 4. When the initiate pairing message is received by the module level devices, MLDs, 4 they do start to send address assignment requests randomly. Once a module level device, MLD, 4 does receive the response from the base station 2 with a proper timing and identifier, the module level device, MLD, 4 can store the assigned PLC address and stop sending address assignment requests on the uplink channel UL-CH. The module level devices, MLDs, 4 with assigned addresses switch into a monitoring mode and wait for synchronization messages. If an initiate pairing message is received again, the module level device, MLD, 4 does reset its assigned PLC address and does start again with the pairing process.

The pairing process is completed when all module level devices, MLDs, 4 got an assigned PLC address. Then, the module level devices, MLDs, 4 wait for the sync message from the base station 2 to start the transmission of the monitoring data. For the base station 2, the pairing process does end when no address request is received during a certain time. Then, the base station 2 can begin the monitoring phase by sending a sync message on the downlink channel DL-CH. The type of the sync message can depend on the RSD status of the base station 2. In a possible embodiment, the signal frame from the base station 2 may use symbols specified in the SunSpec Rapid Shutdown specification Z, W0 or W1 with a symbol length of 56.32 msec.

In a possible embodiment, the initiate pairing message can be sent on the downlink channel DL-CH by the base station 2. It does reset the PLC address of each module level device, MLD, 4 and initiates the pairing process as illustrated in FIG. 17.

Figures 21, 22:
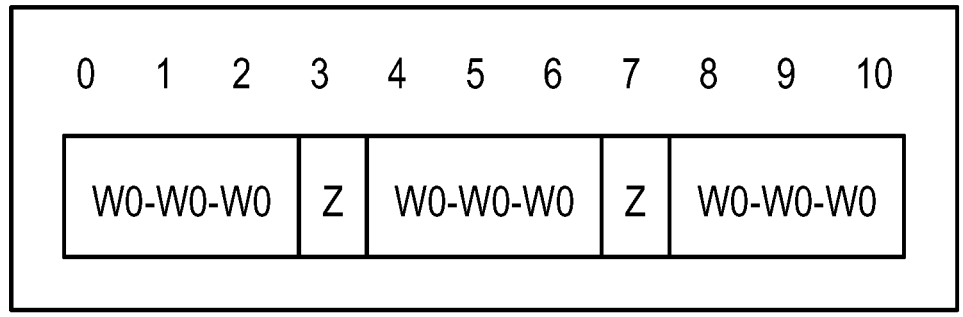
FIG. 21 shows a structure of a pairing initiation frame in a possible embodiment of the present invention.
FIG. 22 illustrates the frame structures in a pairing mode of the system according to the present invention.

FIG. 21 shows a possible data structure of the initiate pairing message used by the system 1 in the pairing process. As can be seen, the packet is sent without any preamble or with the standard spreading coding and bit rate of the base station 2.

In a possible embodiment, the address assignment response frame can use the spreading code modulation specified in the SunSpec Rapid Shutdown PLC standard, i.e. Barker-11 code. The address assignment response can include an acknowledgement of the address request, the repetition of the CRC-5 code included in the request (SEQ) as well as the PLC address assigned to the module level device, MLD, 4. Each symbol can correspond to a spreading code sequence W0, W1 or Z.

FIG. 22 illustrates the structure for a possible implementation of the address assignment response frame used in the pairing process.

The purpose of the guard bits within the address assignment response frame is to avoid sequences within the frame that could be erroneously interpreted as a permission to operate, PTO, message. Consequently, any risk of unwanted activation of the photovoltaic modules is prevented. The address assignment response frame can be transferred in a possible embodiment with a standard data rate of the SunSpec Rapid Shutdown system (bit period: 11×5.12=56.32 msec). The total length of the address assignment response frame can be 1.464 sec in a possible implementation.

The MLD frames of the module level devices 4 can comprise in a possible embodiment a 16-bit preamble followed by 4×16-bit words as illustrated in FIG. 23. In a possible embodiment, Manchester coding can be used as uplink channel coding.

The address request frames can be sent in a possible embodiment by the model level devices, MLDs, 4 on the uplink channel UL-CH during the pairing process. The address assignment request frame is common to all types of module level devices, MLDs, 4. The address assignment request frame can comprise the MLD serial number, an equipment identifier defining the type of the module level device, MLD, 4 and a code sequence generated by the model level device, MLD, 4 before the transmission of the packet to increase the robustness of the pairing process. The same contents can be verified in a possible embodiment by a 16-bit CRC.

FIG. 24 illustrates a possible structure of an address request frame used in the pairing process of the system 1.

A most significant bit MSB can be sent first in each data field. The address request frame can be further encoded using Manchester coding, wherein a 16-bit preamble is added resulting in a total frame length of 92.16 msec as also illustrated in FIG. 25. The address request frame can be transmitted with a standard bit rate of the module level devices, MLDs, 4, e.g. at a speed of 1.5625 kbps.

FIG. 26 is a possible exemplary hardware (HW) and software (SW) architecture of a photovoltaic module level monitoring system 1 according to the present invention. FIG. 26 illustrates a connection of a module level device 4 with a base station 2 via a PV string wherein some functions are implemented by a software SW running on a microcontroller unit MCU and other functions are performed by hardware components HW. As can be seen in the exemplary embodiment illustrated in FIG. 26, a great portion of the signal processing can be done by software components executed on the microcontroller units MCU of the module level devices, MLDs, 4 and the base station 2. This digital processing allows to simplify the analog circuitry within the module level device, MLD, 4 and the base station 2.

As can be seen in FIG. 26 on the left side, a module level device 4 comprises an analog frontend AFE including a coupling duplexer circuit 7A to connect the module level device 4 with the photovoltaic string. The module level device, MLD, 4 comprises a microcontroller unit MCU connected to its analog frontend AFE used for analog to digital (A/D) conversion as well as digital to analog (D/A) conversion and performing RX software functions as well as TX software functions. Further, the module level device 4 can comprise hardware components HW, in particular sensors to perform physical measurements of parameters such as voltage V, current I, temperature T or produced energy E. The RX software functions performed within the microcontroller unit MCU of the MLD 4 comprise the de-modulation (DEM) of the S-FSK signal as well as the decoding (RSD-DEC) of the RSD commands (Keep Alive, Accelerated Shutdown). Further, additional codes of the SunSpec RSD specification are decoded which can be used for MLM synchronization (MLM-SYNC). Further, the RX software functions perform the generation of synchronization signals for the MLM TX subsystem. Further, the software functions of the RX block are used to decode pairing acknowledgement signals during the pairing process.

On the transmitting side (TX), the module level monitoring device 4 performs the following tasks. Hardware components HW can measure the photovoltaic parameters, in particular module voltage V, string current I and module temperature T. Further, the energy production E over the monitoring period can be calculated. The MLD transmitter (TX) assembles the data frame, i.e. identifier, monitoring data as well as status information. The transmitter software TX software executed by the controller MCU can perform the encoding (ENC) of the TX frame, e.g. Manchester coding CRC and preamble. The TX software (TXSW) can further synchronize the TX frame to the RSD signaling. In a further stage, the TX software can perform the FSK modulation (MOD). Finally, the MCU of the MLD4 performs a D/A conversion followed by a low-pass filtering (LPF) within the analog frontend AFE of the MLD4. Further, the power amplifier PA of the analog frontend AFE can perform a signal amplification wherein the amplified signal is supplied to the coupling duplexer circuit 7A as also illustrated in FIG. 26.

FIGS. 27, 28 illustrate the TX data frame assembly performed by the MLD transmitter of the MLD4 comprising a provision of the data with a cyclic redundancy CRC check sum followed by Manchester coding and the addition of a preamble. In the illustrated example, 96 data bits comprise a device identifier (32 bits), an equipment type (4 bits), a photovoltaic module energy of a previous interval $E_n-1$, a status (4 bits) (e.g. module on/off, hardware failure, received downlink signals etc.) a photovoltaic module energy of the current time interval $E_n$, a total photovoltaic voltage V (8 bits), i.e. the instantaneous voltage message as the last sync message, a reserved data field of 8-bit length, a photovoltaic module electrical current I (8 bits), a photovoltaic module temperature T (8 bits) and the cyclic redundancy check code CRC calculated on the previous 96 bits.

FIG. 28 illustrates the TX burst generation which can be performed e.g. once each five to ten minutes in a possible implementation.

As can be seen in FIG. 26, the base station 2 also comprises an analog frontend AFE with a coupling duplexer circuit 7B and a microcontroller unit MCU. The low-pass filter LPF of the analog frontend AFE does suppress components of frequencies, (e.g. at and above 16 MHz) and provide the analog digital converter ADC with a sequential signal from a low impedance source. The BX software functions executed by the microcontroller unit MCU of the base station 2 perform the S-FSK de-modulation, the MLM frame decoding (MLMFDEX) as well as data extraction (DEXT) of the received data, wherein the extracted data are and be supplied to a communication gateway 2D. Further, the base station 2 provides in the transmitting signal path of the analog frontend AFE a power amplifier PA and a low-pass filter LPF connected to a D/A conversion unit of the base station MCU.

According to SunSpec RSD specification, the S-FSK TX signal comprises an amplitude of 1 $V_{RMS}$ without output load. In a possible embodiment, the TX power amplifier PA of the analog frontend AFE of the base station 2 provides for N times this amplitude, wherein N is the winding ratio of the output transformer TR of the coupling duplexer circuit 7B. The output current is sufficient to drive the load impedance of the photovoltaic strings in parallel with the resonant circuit, the whole in series with the resistor R.

The base station transmitter BS-TX of the base station 2 which can be implemented in a possible embodiment by a corresponding TX software executed by the microcontroller unit MCU of the base station 2 to send periodical RSD signals. The only mandatory RSD signal, is the PTO (Permission to Operate) code. When this PTO code is present, the module level devices, MLDs, 4 connect the photovoltaic modules PVM to the PV strings. In contrast, if the permission to operate, PTO, code is absent, the module level device, MLDs, 4 does disconnect the photovoltaic modules PVM from the PV strings. As the PTO code is sent with a very precise period it can be used for the synchronization of the monitoring activity. Further, the transmission software (TX-SW) executed by the MCU of the base station 2 can perform the FSK modulation using look-up tables LUTs. The transitions between different symbols can be smoothened using LUTs generated for baseband (BB) shaping. The modulated signal comprises narrow bands around the carrier frequencies fc.

FIG. 29 illustrates the construction of an RSD S-FSK signal using look-up tables LUT.

In a possible embodiment, in line with the SunSpec Rapid Shut-down specification RSD, a photovoltaic module level monitoring MLM system 1 according to the present invention comprises a maximum number of photovoltaic strings per inverter of 10 and a maximum number of photovoltaic modules PVM per string of 30. Accordingly, in this implementation, data from up to 300 module devices, MLDs, 4 are collected.

In a possible embodiment, the collection of data at the MLD level can be synchronized using fixed time stamps. In a possible embodiment, the monitoring rate can be set comparatively low, e.g. one set of data from each module level device 4 every five to ten minutes. Monitoring is performed in a preferred embodiment without manual configuration of an installer (i.e. plug and play) using the automated pairing process. The modulation scheme used by the system 1 does not interfere with the arc detection system of the inverter.

The photovoltaic module level monitoring MLM system 1 according to the present invention provides a bidirectional powerline communication PLC. On the one hand, the base station 2 which can be integrated in the inverter 6 can send orders to the MLD cluster (i.e. synchronization signals and/or pairing signals) on the downlink communication channel DL-CH. On the other hand, the MLD cluster uses the uplink channel UL-CH to send its monitoring data or other messages such as the pairing requests.

The downlink communication can take advantage of an existing Rapid Shutdown RSD transmitter integrated in the inverter with some modifications. The RSD signal is not disturbed by the extra information transmitted by the MLM downlink communication. As a consequence, a frequency shift modulation according to the RSD specification is kept.

The uplink communication channel UL-CH has to convey more information during the RSD TX period than the downlink channel, e.g. 96 bits against only one single bit. Consequently, the tradeoff between data rate and robustness of communication is different.

There is a mode of operation when the photovoltaic modules are active and a mode of operation when the photovoltaic modules are not active. In a first operation mode where the photovoltaic modules are active, the base station 2 does continuously send the permission to operate, PTO, signals to the module level devices, MLDs, 4 according to the RSD specification. Every five or ten minutes the permission to operate, PTO, message can be replaced by a synchronization message. This synchronization message can trigger the instantaneous measurements done by the module level device 4 and defines the starting point for data integration for each module level device, MLD, 4. The integration of the measurement can end at the next synchronization message.

Between two synchronization messages, each permission to operate, PTO, message defines a time slot where a communication on the uplink channel UL-CH by the module level devices, MLDs, 4 is allowed. Thus, e.g. 560 time slots including one for the synchronization message can be available in a ten-minute monitoring period. If the monitoring period is e.g. reduced to five minutes, only 280 time slots are available.

In a possible embodiment, each time slot except the one of synchronization can be identified with a specific number, e.g. ranging from 1 to 559 (279 for 5 minute periods). The first time slot after the synchronization message comprises the time slot number 1.

Each module level device 4 on the DC link comprises a unique PLC address corresponding to a specific time slot. In order to keep some time for the transmitter of the first module level device, MLD, 4 to process the monitoring data, a predetermined number of initial time slots may not be used. All kinds of data can be sent by the module level devices, MLDs, 4 comprising the instantaneous data and data integrated over monitoring periods. Instantaneous data are acquired simultaneously by each MLD 4 after the sync signal while integrated data can be calculated by the module level devices MLDs 4 during the whole monitoring period as also illustrated in FIGS. 30, 31.

FIG. 30 illustrates synchronization messages and uplink message sequencing. FIG. 31 illustrates the instantaneous transmission of integrated data.

In an other operation mode, the photovoltaic modules are not active. This operation mode allows the monitoring of the photovoltaic modules while maintaining the complete photovoltaic array in a shutdown mode. In this operation mode the base station 2 does send continuously the accelerated shutdown signal to the module level devices, MLDs, 4. After every five or ten minutes, the accelerated shutdown message can be replaced by a synchronization message. In a similar way as with the synchronization message during the active mode, the synchronization message triggers the instantaneous measurements and defines the starting point for data integration for each module level device, MLD, 4.

The base station 2 can turn on and off the photovoltaic array by changing the messages on the downlink channel DL-CH as illustrated in the signal diagram of FIG. 32.

The permission to operate, PTO, and accelerated shutdown messages can be replaced by synchronization messages at the beginning of each monitoring period.

The photovoltaic module level monitoring, MLM, system 1 comprises different main aspects.

A first aspect of the present invention is a module level monitoring, MLM, with asymmetrical bidirectional powerline communication, PLC, using Rapid Shutdown (RSD) signaling as control channels. The RSD signaling can be used also for the synchronization and sequencing of a plurality of monitoring module level devices, MLDs, 4.

A further aspect of the present invention is the coexistence of the simultaneous RSD and MLM transmissions through modulation bandwidth reduction using digital filtering and look-up tables LUTs.

A further aspect of the present invention is the coupling of TX and RX signals to and from the DC power cable using a duplexer circuit 7.

A further aspect of the present invention is a pairing process, i.e. a method for automatic assignment of a unique transmission time slot to each module level device, MLD, 4.

The invention claimed is:

1. A photovoltaic module level monitoring system comprising
    a base station, connected by means of power cables to module level devices, which are provided to monitor and/or to control associated photovoltaic modules, wherein the base station includes;
    a base station transmitter configured to transmit Rapid Shut Down (RSD) control signals in predefined time slots in a downlink channel through said power cables to said module level devices wherein the base station transmitter of the base station, is connected to a Rapid Shut Down (RSD) initiator and is configured to transmit a permission to operate signal periodically in the downlink channel when the RSD initiator indicates that rapid shutdown is not active and is further configured to stop transmitting the permission to operate signal when the RSD initiator indicates that rapid shutdown is active, and includes;
    a base station receiver configured to receive monitoring signals generated by said module level devices through said power cables within time slots via an uplink channel assigned to the module level devices wherein the time slots of the uplink channel assigned to module level devices are inside the predefined time slots of the downlink channel;
    wherein a length of the time slots of the uplink channel is shorter than a length of the time slots of the downlink channel, wherein frequency division multiplexing is used to separate the two monitoring signals and the RSD control signals.

2. The photovoltaic module level monitoring system according to claim 1, wherein the downlink channel used for transmission of the RSD control signals within predefined time slots and the uplink channel used for transmission of the monitoring signals within assigned time slots are synchronized to each other.

3. The photovoltaic module level monitoring system according to claim 1, wherein the modulation bandwidth occupied by the modulated RSD control signal transmitted through the power cables in the downlink channel and the modulated monitoring signal transmitted simultaneously through the power cables in the uplink channel is reduced by baseband pulse shaping.

4. The photovoltaic module level monitoring system according to claim 1, wherein several module level devices and the base station, are connected with each other through power cables in a DC power network.

5. The photovoltaic module level monitoring system according to claim 4, wherein the transmitter and receiver of the base station, and of each module level device, connected to each other through power cables in the DC power network are coupled to said DC power network by means of a duplexer circuit configured to isolate the transmitter from the receiver, comprising a high current transformer.

6. The photovoltaic module level monitoring system according to claim 1, wherein each module level device includes;
    a module level monitoring transmitter configured to transmit a monitoring signal generated by the module level device, in a time slot of the uplink channel assigned to said module level device, to the base station receiver of said base station, and
    a Rapid Shut own receiver (4B) configured to receive a RSD control signal generated by said base station, in a time slot of the downlink channel.

7. The photovoltaic module level monitoring system according to claim 1, wherein each module level device, comprises an assigned unique time slot address number defining a time slot of the uplink channel where the module level monitoring transmitter of said module level device, sends a monitoring signal generated by said module level device, once per monitoring cycle.

8. The photovoltaic module level monitoring system according to claim 7, wherein the unique time slot address number is assigned to the respective level monitoring device, after installation of the photovoltaic module level monitoring system in a pairing process and stored in a local memory of the module level device.

9. The photovoltaic module level monitoring system according to claim 1, wherein the base station receiver of the base station, is connected to a communication gateway via a wired or wireless data network.

10. The photovoltaic module level monitoring system according to claim 1, wherein each module level device, is configured to monitor physical parameters of at least one associated photovoltaic module including a current, a voltage, a temperature and/or energy produced by said photovoltaic module.

11. The photovoltaic module level monitoring system according to claim 1, wherein each module level device, includes a DC switch used for switching on/off its associated photovoltaic module depending on the RSD control signals received by the rapid shutdown receiver of the respective module level device, via the downlink channel.

12. The photovoltaic module level monitoring system according to claim 1, wherein the base station, is integrated in or connected to an inverter configured to convert a DC power supplied by the photovoltaic modules via the power cables to said inverter into an AC current.

13. A method for providing a bidirectional communication between a base station, and module level devices used to monitor and/or to control associated photovoltaic modules, via power cables connecting the base station, with the module level devices the method comprising the steps of:
  (a) transmitting by a base station transmitter of said base station, through said power cables Rapid Shut Down (RSD) control signals to said module level devices in predefined time slots of a downlink channel wherein the base station transmitter of the base station, is connected to a Rapid Shut Down (RSD) initiator and is configured to transmit a permission to operate signal periodically in the downlink channel when the RSD initiator indicates that rapid shutdown is not active and is further configured to stop transmitting the permission to operate signal when the RSD initiator indicates that rapid shutdown is active,
  (b) transmitting monitoring signals simultaneously by the module level devices, through said power cables to a base station receiver of said base station, in time slots of an uplink channel assigned to the module level devices wherein the time slots of the uplink channel assigned to module level devices are inside the predefined time slots of the downlink channel;
  wherein a length of the time slots of the uplink channel is shorter than a length of the time slots of the downlink channel wherein frequency division multiplexing is used to separate the two monitoring signals and the RSD control signals.

* * * * *